US 12,362,171 B2

(12) United States Patent
Chen et al.

(10) Patent No.: US 12,362,171 B2
(45) Date of Patent: Jul. 15, 2025

(54) METHODS AND SYSTEMS FOR FORMING A LAYER COMPRISING ALUMINUM, TITANIUM, AND CARBON

(71) Applicant: ASM IP Holding B.V., Almere (NL)

(72) Inventors: Lifu Chen, Helsinki (FI); Qi Xie, Wilsele (BE); Charles Dezelah, Helsinki (FI); Petro Deminskyi, Helsinki (FI); Giuseppe Alessio Verni, Jodoigne (BE); Petri Raisanen, Gilbert, AZ (US); Eric James Shero, Phoenix, AZ (US)

(73) Assignee: ASM IP Holding B.V., Almere (NL)

( * ) Notice: Subject to any disclaimer, the term of this patent is extended or adjusted under 35 U.S.C. 154(b) by 783 days.

(21) Appl. No.: 17/685,525

(22) Filed: Mar. 3, 2022

(65) Prior Publication Data

US 2022/0285147 A1 Sep. 8, 2022

Related U.S. Application Data

(60) Provisional application No. 63/158,199, filed on Mar. 8, 2021.

(51) Int. Cl.
*C23C 16/32* (2006.01)
*C23C 16/08* (2006.01)
*C23C 16/455* (2006.01)
*C23C 16/52* (2006.01)
*H01L 21/02* (2006.01)

(52) U.S. Cl.
CPC .......... *H01L 21/0228* (2013.01); *C23C 16/08* (2013.01); *C23C 16/45527* (2013.01); *C23C 16/45544* (2013.01); *C23C 16/45553* (2013.01); *C23C 16/52* (2013.01); *H01L 21/02194* (2013.01); *H01L 21/02205* (2013.01)

(58) Field of Classification Search
CPC ... C23C 16/32; C23C 16/08; C23C 16/45527; C23C 16/45544; C23C 16/45553
See application file for complete search history.

(56) References Cited

U.S. PATENT DOCUMENTS

| 10,361,366 B2 | 7/2019 | Hakamata et al. | |
|---|---|---|---|
| 2009/0315093 A1* | 12/2009 | Li | H01L 21/28088 438/584 |
| 2015/0235841 A1* | 8/2015 | Zhu | H01L 21/02178 257/734 |
| 2017/0338109 A1* | 11/2017 | Lei | H01L 21/0234 |
| 2019/0221433 A1* | 7/2019 | Raisanen | H10D 64/667 |

(Continued)

OTHER PUBLICATIONS

Blakeney, Kyle J., et al., "Thermal atomic layer deposition of tungsten carbide films from WCl6 and AlMe3". J. Vac. Sci. Technol. A 36(1), Jan./Feb. 2018, 01A101, pp. 1-6.*

(Continued)

*Primary Examiner* — Bret P Chen
(74) *Attorney, Agent, or Firm* — Snell & Wilmer L.L.P.

(57) ABSTRACT

Disclosed are methods and systems for depositing layers comprising a titanium, aluminum, and carbon. The layers are formed onto a surface of a substrate. The deposition process comprises a cyclical deposition process. Exemplary structures in which the layers may be incorporated include field effect transistors, VNAND cells, metal-insulator-metal (MIM) structures, and DRAM capacitors.

17 Claims, 10 Drawing Sheets

(56) References Cited

U.S. PATENT DOCUMENTS

2021/0066084 A1* 3/2021 Raisanen .......... C23C 16/45553

OTHER PUBLICATIONS

Lee, Younghee, et al., "Trimethylaluminum as the Metal Precursor for the Atomic Layer Etching of Al2O3 Using Sequential, Self-Limiting Thermal Reactions". Chem. Mater. 2016, 28, 2994-3003.*

Hennessy, John, et al., "Aluminum Precursor Interactions with Alkali Compounds in Thermal Atomic Layer Etching and Deposition Processes". ACS Appl. Mater. Interfaces 2021, 13, 4723-4730.*

Mai, Lukas, et al., "Potential Precursor Alternatives to the Pyrophoric Trimethylaluminium for the Atomic Layer Deposition of Aluminium Oxide". Chem. Eur. J. 2019, 25, 7489-7500.*

Xia, Xueming, et al., "Use of a New Non-Pyrophoric Liquid Aluminum Precursor for Atomic Layer Deposition". Materials 2019, 12, 1429, pp. 1-13.*

Mattelaer, Felix, et al., "A liquid alkoxide precursor for the atomic layer deposition of aluminum oxide films". J. Vac. Sci. Technol. A 38, 022417 (2020), pp. 1-6.*

Lim, Booyong, et al., "Atomic layer deposition of transition metals." Nature Materials, vol. 2, Nov. 2003, pp. 749-754.*

Kim, Do-Heyoung, et al., "Characteristics of Tungsten Carbide Films Prepared by Plasma-Assisted ALD Using Bis(tert-butylimido) bis(dimethylamido)tungsten". Journal of The Electrochemical Society, 150 (10) 2003, C740-C744.*

Knisley, Thomas J., et al., "Precursors and chemistry for the atomic layer deposition of metallic first row transition metal films". Coordination Chemistry Reviews vol. 257, Issues 23-24, Dec. 2013, pp. 3222-3231.*

* cited by examiner

METHODS AND SYSTEMS FOR FORMING A LAYER COMPRISING ALUMINUM, TITANIUM, AND CARBON

CROSS-REFERENCE TO RELATED APPLICATIONS

This application claims priority to U.S. Provisional Patent Application Ser. No. 63/158,199 filed Mar. 8, 2021 titled METHODS AND SYSTEMS FOR FORMING A LAYER COMPRISING ALUMINUM, TITANIUM, AND CARBON, the disclosure of which is hereby incorporated by reference in its entirety.

FIELD OF INVENTION

The present disclosure generally relates to the field of semiconductor processing methods and systems, and to the field integrated circuit manufacture. In particular, methods and systems suitable for forming layers comprising aluminum, titanium, and carbon are disclosed.

BACKGROUND OF THE DISCLOSURE

The scaling of semiconductor devices, such as, for example, complementary metal-oxide-semiconductor (CMOS) devices, has led to significant improvements in speed and density of integrated circuits. However, conventional device scaling techniques face significant challenges for future technology nodes.

For example, one challenge has been finding a suitable conducting material for use as a gate electrode in aggressively scaled CMOS devices. Various gate materials might be used, such as, for example, a metal, such as a titanium nitride layer. However, in some cases, where higher work function values than those obtained with titanium nitride layers—e.g., in PMOS regions of a CMOS device—are desired, improved materials for gate electrodes are desired. In particular, such materials can include p-dipole shifting layers, and can be used e.g. for threshold voltage tuning.

In addition, there remains a need for new materials in other semiconductor devices such as MIM (metal-insulator-metal) structures, DRAM capacitors, and VNAND cells.

Any discussion, including discussion of problems and solutions, set forth in this section has been included in this disclosure solely for the purpose of providing a context for the present disclosure. Such discussion should not be taken as an admission that any or all of the information was known at the time the invention was made or otherwise constitutes prior art.

SUMMARY OF THE DISCLOSURE

This summary may introduce a selection of concepts in a simplified form, which may be described in further detail below. This summary is not intended to necessarily identify key features or essential features of the claimed subject matter, nor is it intended to be used to limit the scope of the claimed subject matter.

Various embodiments of the present disclosure relate to methods of depositing a material comprising titanium, aluminum, and carbon, to structures and devices formed using such methods, and to apparatus for performing the methods and/or for forming the structures and/or devices. The layers may be used in a variety of applications, including work function adjustment layers, and threshold voltage adjustment layers. For example, they may be used in a gate electrode in n- or p-channel metal oxide semiconductor field effect transistors (MOSFETS).

Described herein is a method for forming a layer on a substrate. The method comprises providing a substrate in a reaction chamber. The method further comprises executing a plurality of deposition cycles. A deposition cycle comprises an aluminum precursor pulse and a transition metal precursor pulse. The aluminum precursor pulse comprises exposing the substrate to an aluminum precursor. The aluminum precursor comprises aluminum, a first alkyl ligand, and a second alkyl ligand. The first alkyl ligand and the second alkyl ligand are different. The transition metal precursor pulse comprises exposing the substrate to a transition metal precursor. The transition metal precursor comprises a transition metal. Thus, a layer is formed on the substrate. The layer comprises the transition metal, the aluminum, and carbon.

In some embodiments, executing a plurality of deposition cycles is preceded by executing one or more priming steps. A priming step comprises exposing the substrate to the transition metal precursor.

In some embodiments, the aluminum precursor comprises a chemical compound that can be represented by the formula $(L^1)_n(L^2)_{n-1}Al$, wherein $L^1$ is the first alkyl ligand, $L^2$ is the second alkyl ligand, and n is an integer that equals 1 or 2.

In some embodiments, the first alkyl ligand is a C1 to C5 alkyl.

In some embodiments, the second alkyl ligand is a C1 to C5 alkyl.

In some embodiments, $L^1$ is 1,1-dimethylethyl.

In some embodiments, $L^2$ is methyl.

In some embodiments, the aluminum precursor comprises bis(1,1-dimethylethyl)methylaluminum.

In some embodiments, the transition metal precursor comprises a halogen.

In some embodiments, the halogen comprises chlorine.

In some embodiments, the transition metal is selected from tantalum, hafnium, vanadium, zirconium, niobium, molybdenum, tungsten, and titanium.

In some embodiments, subsequent deposition cycles are separated by an inter deposition cycle purge.

In some embodiments, the aluminum precursor pulse and the transition metal precursor pulse are separated by an intra deposition cycle purge.

In some embodiments, the deposition cycles are executed in absence of a plasma.

In some embodiments, the method is carried out until a layer having a thickness of least 0.2 nm to at most 5 nm is formed on the substrate.

In some embodiments, the substrate comprises a monocrystalline silicon wafer.

In some embodiments, the method further comprises a step of exposing the substrate to an oxygen containing gas, thereby at least partially oxidizing the layer comprising the transition metal, the aluminum, and carbon.

Further provided is a semiconductor device comprising a layer formed according to a method as described herein.

Further provided is a VNAND contact comprising a layer deposited by means of a method as described herein.

Further provided is a system comprising: a reaction chamber; an aluminum precursor gas source comprising an aluminum precursor, the aluminum precursor comprising aluminum, a first alkyl ligand, and a second alkyl ligand, the first alkyl ligand and the second alkyl ligand being different; a transition metal precursor gas source comprising a transition metal precursor; and, a controller, wherein the controller is configured to control gas flow into the reaction chamber to form a layer on a substrate comprised in the reaction chamber by means of a method as described herein.

These and other embodiments will become readily apparent to those skilled in the art from the following detailed description of certain embodiments having reference to the attached figures. The invention is not limited to any particular embodiments disclosed.

BRIEF DESCRIPTION OF THE DRAWING FIGURES

A more complete understanding of the embodiments of the present disclosure may be derived by referring to the detailed description and claims when considered in connection with the following illustrative figures.

Figure 1:
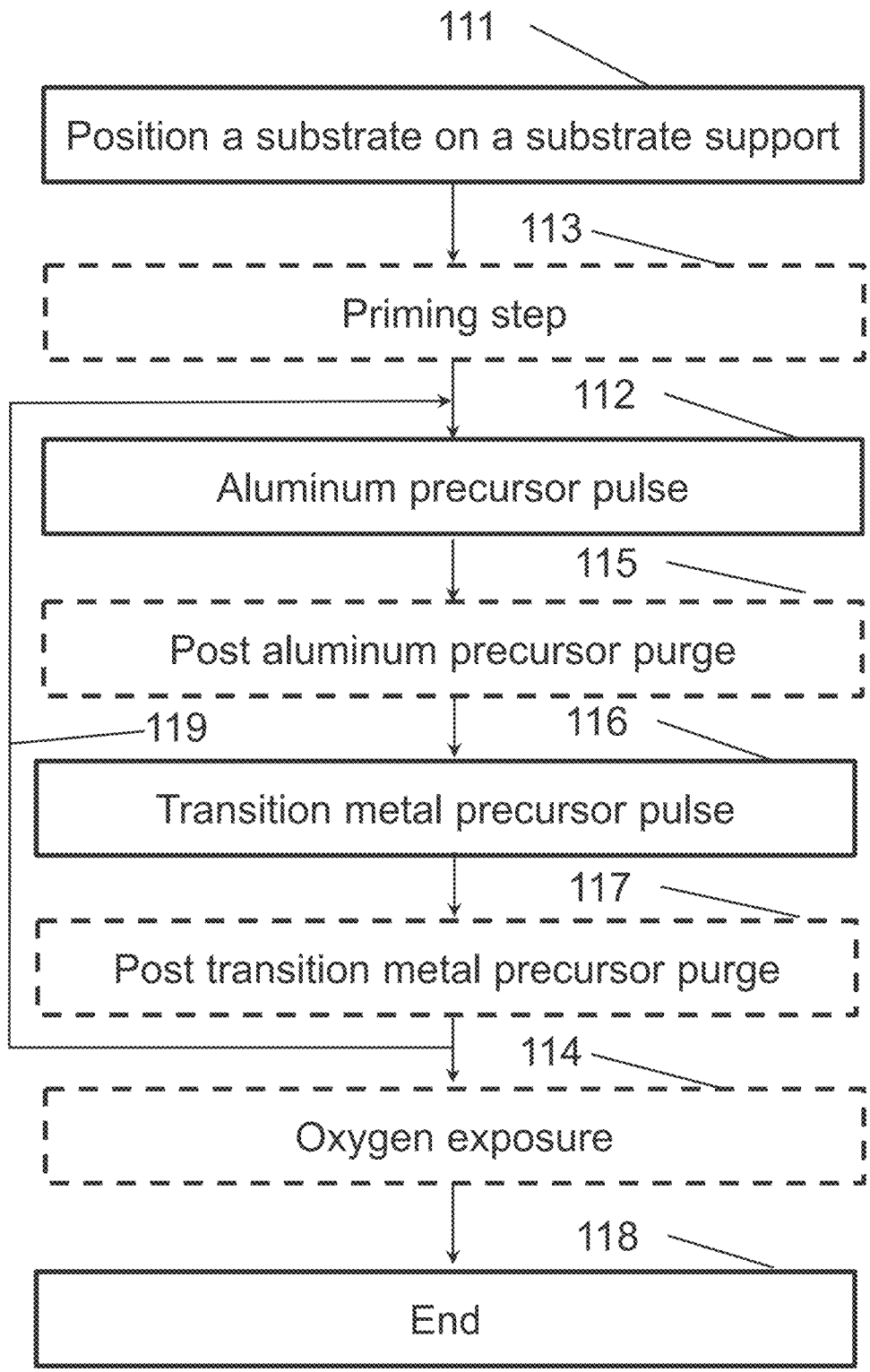
FIG. 1 illustrates an embodiment of a method as disclosed herein.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

As set forth in more detail below, various embodiments of the disclosure provide methods for forming structures, such as gate electrode structures. Exemplary methods can be used to, for example, to form CMOS devices, or portions of such devices. This notwithstanding, and unless noted otherwise, the invention is not necessarily limited to such examples.

In this disclosure, "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, other gas distribution device, or the like, can be used for, e.g., sealing the reaction space, and can include a seal gas, such as a rare gas. In some cases, the term "precursor" can refer to a compound that participates in the chemical reaction that produces another compound, and particularly to a compound that constitutes a film matrix or a main skeleton of a film; the term "reactant" can be used interchangeably with the term precursor.

As used herein, the term "substrate" can refer to any underlying material or materials that can be used to form, or upon which, a device, a circuit, or a film can be formed. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of examples, a substrate can include bulk semiconductor material and an insulating or dielectric material layer overlying at least a portion of the bulk semiconductor material. Additionally or alternatively, an exemplary substrate can comprise bulk semiconductor material and a conductive layer overlying at least a portion of the bulk semiconductor material.

As used herein, the term "film" and/or "layer" can refer to any continuous or non-continuous structure and material, such as material deposited by the methods disclosed herein. For example, a film and/or layer can include two-dimensional materials, three-dimensional materials, nanoparticles, partial or full molecular layers or partial or full atomic layers or clusters of atoms and/or molecules. A film or layer may partially or wholly consist of a plurality of dispersed atoms on a surface of a substrate and/or embedded in a substrate/and/or embedded in a device manufactured on that substrate. A film or layer may comprise material or a layer with pinholes and/or isolated islands. A film or layer may be at least partially continuous. A film or layer may be patterned, e.g. subdivided, and may be comprised in a plurality of semiconductor devices.

As used herein, a "structure" can be or include a substrate as described herein. Structures can include one or more layers overlying the substrate, such as one or more layers formed according to a method as described herein. Device portions can be or include structures.

The term "deposition process" as used herein can refer to the introduction of precursors (and/or reactants) into a reaction chamber to deposit a layer over a substrate. "Cyclical deposition processes" are examples of "deposition processes".

The term "cyclic deposition process" or "cyclical deposition process" can refer to the sequential introduction of precursors (and/or reactants) into a reaction chamber to deposit a layer over a substrate and includes processing techniques such as atomic layer deposition (ALD), cyclical chemical vapor deposition (cyclical CVD), and hybrid cyclical deposition processes that include an ALD component and a cyclical CVD component.

The term "atomic layer deposition" can refer to a vapor deposition process in which deposition cycles, typically a plurality of consecutive deposition cycles, are conducted in a process chamber. The term atomic layer deposition, as used herein, is also meant to include processes designated by related terms, such as chemical vapor atomic layer deposition, atomic layer epitaxy (ALE), molecular beam epitaxy (MBE), gas source MBE, organometallic MBE, and chemical beam epitaxy, when performed with alternating pulses of precursor(s)/reactive gas(es), and purge (e.g., inert carrier) gas(es).

Generally, for ALD processes, during each cycle, a precursor is introduced to a reaction chamber and is chemisorbed to a deposition surface (e.g., a substrate surface that can include a previously deposited material from a previous ALD cycle or other material) and forming about a monolayer or sub-monolayer of material that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. The reactant can be capable of further reaction with the precursor. Purging steps can be utilized during one or more cycles, e.g., during each step of each cycle, to remove any excess precursor from the process chamber and/or remove any excess reactant and/or reaction byproducts from the reaction chamber.

As used herein, the term "purge" may refer to a procedure in which an inert or substantially inert gas is provided to a reaction chamber in between two pulses of gasses that react with each other. For example, a purge, e.g. using an inert gas such as a noble gas, may be provided between a precursor pulse and a reactant pulse, thus avoiding or at least minimizing gas phase interactions between the precursor and the reactant. It shall be understood that a purge can be effected either in time or in space, or both. For example in the case of temporal purges, a purge step can be used e.g. in the temporal sequence of providing a first precursor to a reaction chamber, providing a purge gas to the reaction chamber, and providing a second precursor to the reaction chamber, wherein the substrate on which a layer is deposited does not move. For example in the case of spatial purges, a purge step can take the following form: moving a substrate from a first location to which a first precursor is continually supplied, through a purge gas curtain, to a second location to which a second precursor is continually supplied.

As used herein, a "precursor" includes a gas or a material that can become gaseous and that can be represented by a chemical formula that includes an element which may be incorporated during a deposition process as described herein.

The term "nitrogen reactant" can refer to a gas or a material that can become gaseous and that can be represented by a chemical formula that includes nitrogen. In some cases, the chemical formula includes nitrogen and hydrogen. In some cases, the nitrogen reactant does not include diatomic nitrogen.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments.

In this disclosure, any defined meanings do not necessarily exclude ordinary and customary meanings, in some embodiments.

Described herein is a method for forming a layer on a substrate. The method comprises providing the substrate to a reaction chamber and executing a plurality of deposition cycles. A deposition cycle comprises an aluminum precursor pulse and a transition metal precursor pulse. The aluminum precursor pulse comprises exposing the substrate to an aluminum precursor. The aluminum precursor comprises aluminum, a first alkyl ligand, and a second alkyl ligand. It shall be understood that the first alkyl ligand and the second alkyl ligand are different. The transition metal precursor pulse comprises exposing the substrate to a transition metal precursor. The transition metal precursor comprises a transition metal. Thus, a layer is formed on the substrate. The layer thus formed comprises the transition metal, the aluminum, and carbon.

Without the invention being limited by any particular theory or mode of operation, it is believed that the carbon comprised in the layer is derived from the alkyl ligands comprised in the aluminum precursor.

Layers formed using a presently described method may be useful, for example, as gate stack work function tuning metals in P- or N-MOSFETS. Additionally or alternatively, they may be used in MIM (metal-insulator-metal) metal electrodes and/or in VNAND contacts. They can offer low resistivity, e.g. a lower resistivity compared to titanium nitride layers, even at very low thicknesses, e.g. thicknesses below 4 nm. Advantageously, this low resistivity can be obtained over a wide range of deposition temperatures, and it has been surprisingly found to remain stable over an extended period, e.g. over 3 days.

It shall be understood that depositing a layer as described herein comprises a cyclical deposition process. The cyclical deposition process can include cyclical CVD, ALD, or a hybrid cyclical CVD/ALD process. For example, in some embodiments, the growth rate of a particular ALD process may be low compared with a CVD process. One approach to increase the growth rate may be that of operating at a higher deposition temperature than that typically employed in an ALD process, resulting in some portion of a chemical vapor deposition process, i.e. of non-self-limiting gas phase reactions, but still taking advantage of the sequential introduction of reactants. Such a process may be referred to as cyclical CVD. In some embodiments, a cyclical CVD process may comprise the introduction of two or more precursors or reactants into the reaction chamber, wherein there may be a time period of overlap between the two or more reactants in the reaction chamber resulting in both an ALD component of the deposition and a CVD component of the deposition. This is referred to as a hybrid process. In accordance with further examples, a cyclical deposition process may comprise a continuous flow of one reactant or precursor and periodic pulsing of a second reactant or precursor into the reaction chamber.

In some embodiments, a layer formed in accordance with an embodiment of this disclosure has a step coverage equal to or greater than about 50%, or greater than about 80%, or greater than about 90%, or about 95%, or about 98%, or about 99% or greater, in/on structures having aspect ratios (height/width) of more than about 2, more than about 5, more than about 10, more than about 25, more than about 50, more than about 100, or between about 10 and 100 or about 5 to about 25. It shall be understood that the term "step coverage" refers to the growth rate of a layer on a distal surface of a recess, divided by the growth rate of that layer on a proximal surface of the recess, and expressed as a percentage. It shall be understood that a distal portion of a gap feature refers to a portion of the gap feature which is relatively far removed from a substrate's surface, and that the proximal portion of a gap feature refers to a part of the gap feature which is closer to the substrate's surface compared to the distal/lower/deeper portion of the gap feature.

In some embodiments, a layer deposited by means of a method as described herein comprises metallic aluminum. In some embodiments, the layer comprises from at least 0.01 atomic percent to at most 20.0 atomic percent metallic aluminum, such as from at least 0.01 atomic percent to at most 0.02 atomic percent metallic aluminum, or from at least 0.02 atomic percent to at most 0.05 atomic percent metallic aluminum, or from at least 0.05 atomic percent to at most 0.1 atomic percent metallic aluminum, or from at least 0.1 atomic percent to at most 0.2 atomic percent metallic aluminum, or from at least 0.2 atomic percent to at most 0.5 atomic percent metallic aluminum, or from at least 0.5 atomic percent to at most 1.0 atomic percent metallic aluminum, or from at least 1.0 atomic percent to at most 2.0 atomic percent metallic aluminum, or from at least 2.0 atomic percent to at most 5.0 atomic percent metallic aluminum, or from at least 5.0 atomic percent to at most 10.0 atomic percent metallic aluminum, or from at least 10.0 atomic percent to at most 20.0 atomic percent metallic aluminum.

In some embodiments, executing the plurality of deposition cycles is preceded by executing one or more priming steps. It shall be understood that a priming step comprises exposing the substrate to a precursor. In some embodiments, a priming step comprises exposing the substrate to the aluminum precursor. In some embodiments, a priming step comprises exposing the substrate to the transition metal precursor.

Suitably, and in some embodiments, the aluminum precursor comprises a chemical compound represented by the formula $(L^1)_n(L^2)_{n-1}Al$. It shall be understood that $L^1$ is the first alkyl ligand, $L^2$ is the second alkyl ligand, and n is an integer that equals 1 or 2. It shall be understood that $L^1$ and $L^2$ are different. In other words, while $L^1$ and $L^2$ are both an alkyl, they are different alkyls. In other words, $L^1$ and $L^2$ are not identical. It shall be understood that the first alkyl ligand is bonded to the aluminum comprised in the aluminum precursor. Furthermore, it shall be understood that the second alkyl ligand is also bonded to the aluminum comprised in the aluminum precursor. Such precursors, and methods for synthesizing such precursors, are disclosed in U.S. provisional patent application No. 63/064,275.

It shall be understood that these precursors do not necessarily exist, or do not necessarily exist solely, in monomeric form. Thus, these precursors may partly or completely form dimers. For example, a precursor represented by the formula $(L^1)_n(L^2)_{n-1}Al$, may exist in the form of dimers, specifically $(L^1)_2Al(L^2)_2Al(L^1)_2$, where $L^1$ are terminal t-butyl groups, and $L^2$ are methyl groups that bridge between the two aluminum atoms. It shall be understood that the precursor may exist in a certain, e.g. dimeric, form as a solid, and in another, e.g. monomeric, form in the gas phase. A precursor may exist as a mixture of monomers and dimers, in at least one of the solid phase, in the liquid phase, and the gas phase. Additionally or alternatively, a precursor may exist solely as a monomer or a dimer in at least one of the solid phase, the liquid phase, and the gas phase.

In some embodiments, the first alkyl ligand, i.e. $L^1$, can comprise a $C_1$ to $C_5$ alkyl. In some embodiments, the first alkyl ligand consists, or essentially consists, of a $C_1$ to $C_5$ alkyl.

Additionally or alternatively, and in some embodiments, the first alkyl ligand, i.e. $L^2$, can comprise a $C_1$ to $C_5$ alkyl. In some embodiments, the second alkyl ligand consists, or essentially consists, of a $C_1$ to $C_5$ alkyl.

$L^1$ can comprise, for example, an alkyl selected from methyl, ethyl, propyl, butyl, and pentyl. In some embodiments, $L^1$ comprises butyl.

$L^2$ can comprise, for example, an alkyl selected from methyl, ethyl, propyl, butyl, and pentyl, with the proviso that $L^2$ does not equal $L^1$. In some embodiments, $L^2$ comprises methyl.

In some embodiments, at least one of $L^1$ and $L^2$ is selected from butyl, 1-methylpropyl, 2-methylpropyl, and 1,1-dimethylethyl. In some embodiments, $L^1$ comprises 1,1-dimethylethyl, i.e. 1,1-dimethylethyl.

In some embodiments, at least one of $L^1$ and $L^2$ is selected from pentyl, 1,1-Dimethylpropyl, 2,2-dimethylpropyl, 3-methylbutyl, 1-Methylbutyl, 1-Ethylpropyl, 1,2-Dimethylpropyl, and 2-methylbutyl.

In some embodiments, at least one of $L^1$ and $L^2$ is selected from propyl, 1-methylethyl, and cyclopropyl.

In some embodiments, at least one of $L^1$ and $L^2$ is ethyl.

In some embodiments, at least one of at least one of $L^1$ and $L^2$ is methyl.

In some embodiments, the aluminum precursor comprises bis(1,1-dimethylethyl)methylaluminum. Bis(1,1-dimethylethyl)methylaluminum can be particularly advantageous. It was found that this precursor shows no degradation over 8 weeks at 62° C. At this temperature, the precursor has a vapor pressure of around 1 Torr, such that it can be easily provided to a reaction chamber.

In some embodiments, $L^1$ is a branched C4 to C8 alkyl bonded to aluminum through a carbon atom that is bonded to three carbon atoms. In other words, the aluminum atom comprised in the aluminum precursor is bonded to a carbon atom, which again is attached to three carbon atoms (the three "branching carbon atoms"). Such alkyl ligands occupy a large space around the metal atom, and may create steric effects to reactions, and the spatial orientation of the atoms also may affect bond strength. This $L^1$ can be an alkyl group containing from four to eight carbon atoms, i.e. it is a C4 to C8 alkyl. It may thus contain four, five, six, seven or eight carbon atoms. Since, in these embodiments, the carbon atom being bonded to the metal atom is connected to three other carbon atoms, the smallest $L^1$ ligand in such embodiments is a tertbutyl group. In some embodiments, $L^1$ is 1,1-dimethylethyl.

In some embodiments, any one of the three branching carbon atoms may have one or more further carbon atoms attached to it. Often, there is one or two further carbon atoms attached to a branching carbon atom. In some embodiments, one or two of the three branching carbon atoms has one or more further carbon atoms attached to it. In some embodiments, all three of the branching carbon atoms have further carbon atoms attached to them. In some embodiments, $L^1$ is a C4 or C5 alkyl. In such embodiments, one of the branching carbon atoms has one additional carbon atom attached to it. In some embodiments, $L^1$ is a C4 to C6 alkyl. In such embodiments, one branching carbon atom may have two further carbon atoms attached to it. Alternatively, two of the branching carbon atoms may have one further carbon atom attached to each branching carbon atom.

In some embodiments, the aluminum atom is bonded to two l2 ligands. In some embodiments, both $L^1$ ligands are identical. Having two identical l2 ligands may simplify the precursor synthesis process compared to having two different $L^1$ ligands in the metal alkyl precursor.

In some embodiments, $L^2$ is a linear C1 to C4 alkyl. Thus, $L^2$ is smaller than $L^1$. In some embodiments, $L^2$ is methyl or ethyl. In some embodiments, $L^2$ is propyl. In some embodiments, $L^2$ is butyl. In some embodiments, $L^1$ is 1,1-dimethylethyl and $L^2$ is methyl. In some embodiments, $L^1$ is 1,1-dimethylethyl and $L^2$ is ethyl. In some embodiments, $L^1$ is 1,1-dimethylethyl and $L^2$ is propyl.

In some embodiments, $L^1$ is 1,1-dimethylpropyl and $L^2$ is methyl. In some embodiments, $L^1$ is 1,1-dimethylpropyl and $L^2$ is ethyl. In some embodiments, $L^1$ is 1,1-dimethylpropyl and $L^2$ is propyl. In some embodiments, $L^1$ is 1,1-dimethylpropyl and $L^2$ is butyl.

In some embodiments, the $L^1$ is 1-ethyl-1-methylpropyl and $L^e$ is methyl. In some embodiments, $L^1$ is 1-ethyl-1-methylpropyl and $L^2$ is ethyl. In some embodiments, $L^1$ is 1-ethyl-1-methylpropyl and $L^2$ is propyl. In some embodiments, $L^1$ is 1-ethyl-1-methylpropyl and $L^2$ is butyl.

In some embodiments, $L^1$ is 1,1-diethylpropyl and $L^2$ is methyl. In some embodiments, $L^1$ is 1,1-diethylpropyl and $L^2$ is ethyl. In some embodiments, $L^1$ is 1,1-diethylpropyl and $L^2$ is propyl. In some embodiments, $L^1$ is 1,1-diethylpropyl and $L^2$ is butyl.

In some embodiments, the transition metal precursor comprises at least one of tantalum, hafnium, vanadium, zirconium, niobium, molybdenum, tungsten, and titanium.

In some embodiments, the transition metal precursor comprises at least one of titanium and vanadium.

In some embodiments, the transition metal precursor comprises a halogen. For example, the halogen can be selected from fluorine, chlorine, bromine, and iodine. In some embodiments, the halogen comprises chlorine.

The transition metal precursor can comprise a transition metal in any suitable oxidation state. For example, the transition metal precursor can comprise a transition metal in oxidation state +2, +3, +4, or +5. In some embodiments, the transition metal precursor comprises a transition metal in oxidation state +4. In some embodiments, the transition metal precursor comprises Ti in a +4 oxidation state.

In some embodiments, the transition metal precursor comprises a titanium precursor. Suitable titanium precursors include halides. Thus, in some embodiments, the titanium precursor comprises a titanium halide such as titanium chloride, titanium fluoride, titanium bromide, or titanium iodide. In some embodiments, the titanium precursor comprises one or more compounds selected from titanium (II) chloride, titanium (III) chloride, titanium (IV) chloride; and a mixture thereof. In some embodiments, the transition metal precursor comprises $TiCl_4$.

In some embodiments, the transition metal precursor comprises a vanadium precursor. Suitable vanadium precursors include halides. Thus, in some embodiments, the vanadium precursor comprises a vanadium halide such as vanadium chloride, vanadium fluoride, vanadium bromide, or vanadium iodide. In some embodiments, the vanadium precursor comprises one or more compounds selected from vanadium (II) chloride, vanadium (III) chloride, vanadium (IV) chloride, and mixtures thereof.

In some embodiments, the transition metal precursor comprises a hafnium precursor. Suitable hafnium precursors include halides. Thus, in some embodiments, the hafnium precursor comprises a hafnium halide such as hafnium chloride, hafnium fluoride, hafnium bromide, or hafnium iodide. In some embodiments, the hafnium precursor comprises one or more compounds selected from hafnium (II) chloride, hafnium (III) chloride, hafnium (IV) chloride; and a mixture thereof. In some embodiments, the transition metal precursor comprises $HfCl_4$.

A layer having a desired thickness can be formed on the substrate by executing a suitable number of deposition cycles. The total number of deposition cycles comprised in a method as described herein depends, inter alia, on the total layer thickness that is desired. In some embodiments, the method comprises from at least 2 deposition cycles to at most 5 deposition cycles, or from at least 5 deposition cycles to at most 10 deposition cycles, or from at least 10 deposition cycles to at most 20 deposition cycles, or from at least 20 deposition cycles to at most 50 deposition cycles, or from at least 50 deposition cycles to at most 100 deposition cycles, or from at least 100 deposition cycles to at most 200 deposition cycles, or from at least 200 deposition cycles to at most 500 deposition cycles, or from at least 500 deposition cycles to at most 1000 deposition cycles, or from at least 1000 deposition cycles to at most 2000 deposition cycles, or from at least 2000 deposition cycles to at most 5000 deposition cycles, or from at least 5000 deposition cycles to at most 10000 deposition cycles.

In some embodiments, the layer thus formed has a thickness from at least 0.2 nm to at most 5 nm, or from at least 0.3 nm to at most 4 nm, or from at least 0.4 nm to at most 3 nm, or from at least 0.5 nm to at most 2 nm, or from at least 0.7 nm to at most 1.5 nm or of at least 0.9 nm to at most 1.0 nm.

In some embodiments, the layer thus formed has a thickness of at most 5.0 nm, or a thickness of at most 4.0 nm, or a thickness of at most 3.0 nm, or a thickness of at most 2.0 nm, or a thickness of at most 1.5 nm, or a thickness of at most 1.0 nm, or a thickness of at most 0.8 nm, or a thickness of at most 0.6 nm, or a thickness of at most 0.5 nm, or a thickness of at most 0.4 nm, or a thickness of at most 0.3 nm, or a thickness of at most 0.2 nm, or a thickness of at most 0.1 nm.

In some embodiments, the transition metal precursor pulse lasts from at least 0.01 s to at most 240 s, or from at least 0.02 s to at most 120 s, or from at least 0.05 s to at most 60 s, or form at least 0.1 s to at most 30 s, or form at least 0.2 s to at most 15 s, or from at least 0.25 s to at most 6.0 s, or from at least 0.5 s to at most 4.0 s, or from at least 1.0 s to at most 3.0 s.

In some embodiments, the aluminum precursor pulse lasts from at least 0.5 s to at most 20.0 s, or from at least 1.0 s to at most 12.0 s, or from at least 4.0 s to at most 8.0 s.

In some embodiments, the transition metal precursor pulse may comprise a plurality of transition metal precursor sub-pulses. The transition metal precursor sub pulses may be suitably separated by transition metal precursor sub-purges. For example, a transition metal precursor sub-pulse may last from at least 0.01 seconds to at most 10.0 seconds, or from at least 0.02 seconds to at most 5.0 second, or from at least 0.5 seconds to at most 2.0 seconds, or from at least 0.7 seconds to at most 1.0 seconds. For example, a transition metal precursor sub-purge may last from at least 0.01 s to at most 30.0 s, or from at least 0.02 s to at most 20.0 s, or from at least 0.05 s to at most 10.0 s, or from at least 0.1 s to at most 5.0 s, or from at least 0.2 s to at most 2.0 s, or from at least 0.5 s to at most 1.0 s. In some embodiments, the transition metal precursor pulse comprises from at least 2 to at most 1000 transition metal precursor sub-pulses, or from at least 5 to at most 500 transition metal precursor sub-pulses, or from at least 10 to at most 200 transition metal precursor sub-pulses, or from at least 20 to at most 100 transition metal precursor sub-pulses.

In some embodiments, the aluminum precursor pulse may comprise a plurality of aluminum precursor sub-pulses. The aluminum precursor sub-pulses may be suitably separated by aluminum precursor sub-purges. For example, an aluminum precursor sub-pulse may last from at least 0.01 seconds to at most 10.0 seconds, or from at least 0.02 seconds to at most 5.0 second, or from at least 0.5 seconds to at most 2.0 seconds, or from at least 0.7 seconds to at most 1.0 seconds. For example, an aluminum precursor sub-purge may last from at least 0.01 s to at most 30.0 s, or from at least 0.02 s to at most 20.0 s, or from at least 0.05 s to at most 10.0 s, or from at least 0.1 s to at most 5.0 s, or from at least 0.2 s to at most 2.0 s, or from at least 0.5 s to at most 1.0 s. In some embodiments, the aluminum precursor pulse comprises from at least 2 to at most 1000 aluminum precursor sub-pulses, or from at least 5 to at most 500 aluminum precursor sub-pulses, or from at least 10 to at most 200 aluminum precursor sub-pulses, or from at least 20 to at most 100 aluminum precursor sub-pulses.

In some embodiments, subsequent deposition cycles are separated by an inter deposition cycle purge. In some embodiments, the duration of the inter-deposition cycle purge is from at least 0.01 s to at most 30.0 s, or from at least 0.015 s to at most 25.0 s, or from at least 0.02 s to at most 20.0 s, or from at least from at least 0.025 s to at most 10.0 s, or from at least 0.1 s to at most 5.0 s, or from at least 1.0 s to at most 3.0 s, or from at least 30 s to at most 120 s, or from at least 40 s to at most 100 s, or from at least 50 s to at most 80 s.

In some embodiments, the aluminum precursor pulse and the transition metal precursor pulse are separated by an intra deposition cycle purge. In some embodiments, the duration of the intra deposition cycle purge is from at least 0.01 s to at most 120 s, or from at least 0.015 s to at most 60 s, or from at least 0.02 s to at most 30 s, or from at least 0.025 s to at most 10.0 s, or from at least 0.5 s to at most 8.0 s, or from at least 2.0 s to at most 6.0 s, or from at least 3.0 s to at most 5.0 s.

It shall be understood that providing purge steps between subsequent pulses or deposition cycles suitably allows minimizing parasitic reactions between the transition metal precursor and the aluminum precursor.

In some embodiments, the deposition cycles are executed in absence of a plasma. In other words, the deposition cycles are thermal, in some embodiments. In other words, and in some embodiments, the methods described herein do not include use of a plasma to form activated species for use in the deposition process.

In some embodiments, the aluminum content of the layer formed by means of a method as described herein is from at least 1.0 atomic percent to at most 70.0 atomic percent, or from at least 2.0 atomic percent to at most 10.0 atomic percent, or from at least 3.0 atomic percent to at most 8.0 atomic percent, or from at least 4.0 atomic percent to at most 6.0 atomic percent, or from at least 10.0 atomic percent to at most 60.0 atomic percent, or from at least 13.0 atomic percent to at most 50.0 atomic percent, or from at least 15.0 atomic percent to at most 40.0 atomic percent, or from at least 20.0 atomic percent to at most 30.0 atomic percent. In some embodiments, the aluminum content of the layer is higher than 11.0 atomic percent.

In some embodiments, the transition metal content of the layer formed by means of a method as described herein is from at least 1.0 atomic percent to at most 90.0 atomic percent, or from at least 3.0 atomic percent to at most 80.0 atomic percent, or from at least 5.0 atomic percent to at most 70.0 atomic percent, or from at least 10.0 atomic percent to at most 60.0 atomic percent, or from at least 20.0 atomic percent to at most 50.0 atomic percent, or from at least 30.0 atomic percent to at most 40.0 atomic percent.

In some embodiments, the carbon content of the layer formed by means of a method as described herein is from at least 1.0 atomic percent to at most 60.0 atomic percent, or from at least 3.0 atomic percent to at most 50.0 atomic percent, or from at least 5.0 atomic percent to at most 40.0 atomic percent, or from at least 10.0 atomic percent to at most 30.0 atomic percent, or from at least 15.0 atomic percent to at most 25.0 atomic percent.

In some embodiments, the elemental concentration of the layer formed by means of a method as described herein is constant over its entire thickness, e.g. within a margin of error of at most 20 atomic percent, or of at most 10 atomic percent, or of at most 5 atomic percent, or of at most 1 atomic percent. Alternatively, the concentration of one or more elements can gradually change, e.g. increase or decrease, throughout the thickness of a layer that is deposited by means of a method as described herein.

In some embodiments, the layer is deposited at a substrate temperature of less than 800° C., or of at least 200° C. to at most 600° C., or of at least 300° C. to at most 500° C., or of at least 350° C. to at most 450° C.

In some embodiments, the method comprises bringing the aluminum precursor from an aluminum precursor source to the reaction chamber. The aluminum precursor source can be suitably maintained at a temperature of at least 20° C. to at most 100° C., or at a temperature of at least 30° C. to at most 80° C., or at a temperature of at least 40° C. to at most 60° C., for example at a temperature of 50° C.

In some embodiments, the method comprises bringing the transition metal precursor from a transition metal precursor source to the reaction chamber. The transition metal precursor source can be suitably maintained at a temperature of at least 20° C. to at most 100° C., or at a temperature of at least 30° C. to at most 80° C., or at a temperature of at least 40° C. to at most 60° C., for example at a temperature of 50° C.

In some embodiments, the aluminum precursor source and the transition metal precursor source are maintained at the same temperature.

In some embodiments, the aluminum precursor and the transition metal precursor are provided to the reaction chamber via a showerhead injector. In some embodiments, the showerhead injector is maintained at a showerhead injector temperature of at least 50° C. to at most 200° C., or at least 60° C. to at most 180° C., or of at least 70° C. to at most 160° C., or of at least 80° C. to at most 140° C., or of at least 100° C. to at most 120° C.

In some embodiments, the presently described methods are carried out at a pressure of less than 760 Torr or of at least 0.2 Torr to at most 760 Torr, of at least 1 Torr to at most 100 Torr, or of at least 1 Torr to at most 10 Torr. In some embodiments, the layer is deposited at a pressure of at mot 10.0 Torr, or at a pressure of at most 5.0 Torr, or at a pressure of at most 3.0 Torr, or at a pressure of at most 2.0 Torr, or at a pressure of at most 1.0 Torr, or at a pressure of at most 0.1 Torr, or at a pressure of at most $10^{-2}$ Torr, or at a pressure of at most $10^{-3}$ Torr, or at a pressure of at most $10^{-4}$ Torr, or at a pressure of at most $10^{-5}$ Torr, or at a pressure of at least 0.1 Torr to at most 10 Torr, or at a pressure of at least 0.5 Torr to at most 8 Torr, or at a pressure of at least 1.0 Torr to at most 5.0 Torr.

In some embodiments, a layer deposited by means of a method as described herein has a work function of at least 4.0 eV to at most 5.0 eV, or a work function of at least 4.0 eV to at most 4.2 eV, or a work function of at least 4.2 eV to at most 4.4 eV, or a work function of at least 4.4 eV to at most 4.6 eV, or a work function of at least 4.6 eV to at most 4.8 eV, or a work function of at least 4.8 eV to at most 5.0 eV. Advantageously, such a work function can be obtained at a layer thickness of at least 0.3 nm to at most 0.5 nm, or of at least 0.5 nm to at most 1.0 nm, or of at least 1.0 nm to at most 2.0 nm, or of at least 2.0 nm to at most 5.0 nm, or of at least 5.0 nm to at most 10.0 nm, or of at least 10.0 nm to at most 20.0 nm, or of at least 20.0 nm to at most 50.0 nm, or of at least 50.0 nm to at most 50.0 nm to at most 100.0 nm.

In some embodiments, a layer is grown by means of a method as described herein at a growth rate of at least 0.01 nm per cycle to at most 1.0 nm per cycle, or at a growth rate of at least 0.01 nm per cycle to at most 0.02 nm per cycle, or at a growth rate of at least 0.02 nm per cycle to at most 0.05 nm per cycle, or at a growth rate of at least 0.05 nm per cycle to at most 0.1 nm per cycle, or at a growth rate of at least 0.1 nm per cycle to at most 0.2 nm per cycle, or at a growth rate of at least 0.2 nm per cycle to at most 0.5 nm per cycle, or at a growth rate of at least 0.5 nm per cycle to at most 1.0 nm per cycle, In some embodiments, the method further comprises a step of exposing the substrate to an oxygen containing gas. Thus, the layer deposited by means of a method as described herein can be at least partially oxidized. Suitable oxygen containing gasses include atmospheric air, $O_2$, ozone, water, hydrogen peroxide, and mixtures thereof.

In some embodiments, the method is carried out until a layer having a thickness of least 0.2 nm to at most 5 nm is formed on the substrate.

A monocrystalline silicon wafer may be a suitable substrate. Other substrates may be suitable well, e.g. monocrystalline germanium wafers, gallium arsenide wafers, quartz, sapphire, glass, steel, aluminum, silicon-on-insulator substrates, plastics, etc. A substrate can comprise a surface layer on which a layer deposited by means of a method as described herein is formed. Suitable surface layer include conductive layers such as metals or certain nitrides. A suitable nitride includes titanium nitride. Other suitable surface layers include high-k dielectric layers such as hafnium oxide.

In accordance with yet additional embodiments of the disclosure, a device or portion thereof can be formed using a method and/or a structure as described herein. The device can include a substrate, an insulating or dielectric layer, a layer deposited by means of a method as described herein overlying the insulating or dielectric layer, and optionally an additional metal layer overlying the layer deposited by means of a method as described herein. Optionally, a further metal layer may be provided between the layer deposited by means of a method as described herein and the insulating or dielectric layer. The device can be or form part of, for example, a MOSFET, e.g. a pMOSFET or an nMOSFET.

In some embodiments, the MOSFET device may be a pmos field effect transistor. Thus, further provided is a pmos field effect transistor comprising a threshold voltage tuning layer deposited by means of a method as described herein. Suitably, the threshold voltage shifting layer is comprised in a gate electrode comprised in the field effect transistor.

In some embodiments, the MOSFET device may be an nmos field effect transistor. Thus, further provided is an nmos field effect transistor comprising a threshold voltage tuning layer deposited by means of a method as described herein. Suitably, the threshold voltage shifting layer is comprised in a gate electrode comprised in the field effect transistor.

Further described is a gate-all-around field effect transistor. It comprises a gate contact comprising a layer that is formed according to a method as described herein.

Further provided is a MIM metal electrode comprising a layer deposited by means of a method as described herein.

Further provided is a VNAND contact comprising a layer deposited by means of a method as described herein.

Further provided herein is a Dynamic random-access memory (DRAM) cell electrode comprising a layer that is formed according to a method as described herein.

Further provided herein is a wire partially or wholly lined with a layer which is deposited by means of a method as described herein. In some embodiments, the wire comprises copper. In some embodiments, the wire comprises tungsten. In some embodiments, the wire comprises a core that consists of, or that substantially consists of, copper and/or tungsten. It shall be understood that the term "wire" may refer to an interconnect or to a plurality of interconnects, which are commonly encountered in integrated circuits. The term "wire" includes bitlines, wordlines, electrical connections through vias, electrical connections embedded in a low-k dielectric, and the like.

Further described herein is a system. The system comprises a reaction chamber, an aluminum precursor gas source, a transition metal precursor gas source, and a controller. The reaction chamber comprises a substrate. The aluminum precursor gas source comprises an aluminum precursor. The aluminum precursor comprises aluminum, a first alkyl ligand, and a second alkyl ligand. It shall be understood that the first alkyl ligand and the second alkyl ligand are different. The transition metal precursor gas source comprises a transition metal precursor. The transition metal precursor comprises a transition metal. The controller is configured to control gas flow into the reaction chamber to form a layer on the substrate by means of a method as described herein.

FIG. 1 shows a schematic representation of an embodiment of a method as described herein. The method (100) can be used to, for example, form a gate electrode structure suitable for NMOS, PMOS, and/or CMOS devices, such as for use as a work function metal in a gate, source, or drain electrode of a metal oxide semiconductor. However, unless otherwise noted, the presently described methods are not limited to such applications. The method according to FIG. 1 comprises a step (111) of positioning a substrate on a substrate support. The substrate support is positioned in a reaction chamber. Suitable substrate supports include pedestals, susceptors, and the like. An aluminum precursor pulse (112) is then carried out. During the aluminum precursor pulse, an aluminum precursor is provided to the reaction chamber.

Optionally, the reaction chamber is then purged (115) by means of a post aluminum precursor purge. Purging can be done, for example, by means of a noble gas. Exemplary noble gasses include He, Ne, Ar, Xe, and Kr. Alternatively, the purging can comprise transporting the substrate through a purge gas curtain. During a purge, surplus chemicals and reaction byproducts, if any, can be removed from the substrate surface or reaction chamber, such as by purging the reaction space or by moving the substrate, before the substrate is contacted with the next reactive chemical. Then, a transition metal precursor pulse (116) is carried out. Optionally, the reaction chamber is then purged (117) by means of a post transition metal precursor purge. Alternatively, the post transition metal precursor purge can comprise transporting the substrate through a purge gas curtain. A deposition cycle comprising the aluminum precursor pulse (112) and the transition metal precursor pulse (116) is repeated (119) one or more times. This method is continued until a layer having a pre-determined thickness is formed on the substrate. When a suitable thickness is obtained, the method can end (118), and subsequent layers, e.g. another conductive material, can be deposited on top of this layer. Alternatively, the substrate can be exposed to an oxygen-containing gas such as $O_2$ before another layer is deposited on top of the layer deposited by means of a method as described herein. Such a post-deposition oxidation step (114) can suitably be used to further tune the effective work function of an electrode comprising a layer that is deposited according to an embodiment of a method as described herein. Optionally, the deposition cycles are preceded by a priming step (113). The priming step can comprise exposing the substrate to a transition metal precursor. Alternatively, the priming step can comprise exposing the substrate to an aluminum precursor. The priming step can enhance layer quality. Additionally or alternatively, the priming step can improve layer uniformity. Additionally or alternatively, the priming step can enhance the growth rate during the first deposition cycles.

A method according to FIG. 1 can include heating the substrate to a desired deposition temperature within the reaction chamber. Suitable substrate temperatures are described elsewhere herein. Additionally, a method according to FIG. 1 can include heating one or more precursor vessels to a desired precursor vessel temperature. Suitable precursor vessel temperatures are described elsewhere herein. Additionally, a method according to FIG. 1 can include heating a gas injector, e.g. a showerhead injector, comprised in the reaction chamber to a desired injector temperature. Suitable injector temperatures are described elsewhere herein.

A method according to FIG. 1 can include controlling a pressure in the reaction chamber to a desired reaction chamber pressure. Suitable reaction chamber pressures are described elsewhere herein.

In an exemplary embodiment, the aluminum precursor comprises bis(1,1-dimethylethyl)methylaluminum, and the transition metal precursor comprises $TiCl_4$. Layers comprising titanium, aluminum, and carbon, i.e. TiAlC films, deposited using bis(1,1-dimethylethyl)methylaluminum and titanium tetrachloride according to an embodiment of a method as described herein display a low sheet resistance. In particular, a TiAlC film deposited by means of a method as described herein can have a lower resistivity than a comparable TiN film at thicknesses below 4 nm. Also, the film's resistivity has been found to be surprisingly stable for a wide range of thicknesses and deposition temperatures. A layer deposited by means of a method as described herein can have a high Al content, e.g. an aluminum content in excess of 11 atomic percent, and can feature excellent elemental composition uniformity across the film. A layer deposited by means of a method as described herein can have an effective work function at a film thickness of only 2 nm. An exemplary method as described herein can have a suitable growth rate, e.g. a growth rate of 0.1 nm per cycle to 2.0 nm per cycle, e.g. a growth rate of 0.25 nm per cycle. It shall be understood that the specific growth rate and the specific effective work function value can be fine-tuned by applying routine experimentation to a desirable value, e.g. by varying process parameters and/or by substituting at least a part of the titanium precursor for another transition metal halide, such as $VCl_4$.

In another exemplary embodiment of a method as described herein, Bis(1,1-dimethylethyl)methylaluminum was used as an aluminum precursor and $TiCl_4$ was used as a titanium precursor. The method starts with a priming step, in which $TiCl_4$ is provided in 10 subsequent transition metal precursor pulses which are separated by purges. During the priming step, the transition metal precursor pulse lasts for 2 s, and the purge between two subsequent transition metal precursor pulses lasts 1.5 s. After the priming step, a deposition step occurs. During the deposition step, $TiCl_4$ is used as a transition metal precursor and bis(1,1-dimethylethyl)methylaluminum is used as an aluminum precursor. The deposition process comprises a plurality of subsequent aluminum precursor pulses and transition metal precursor pulses. The aluminum precursor pulses comprise 3 aluminum precursor sub pulses, which are separated by aluminum precursor sub purges. The aluminum precursor sub pulses last 6 seconds, the aluminum precursor sub purges last 6 seconds, and the transition metal precursor pulses last 2 seconds. The aluminum precursor pulses and the transition metal precursor pulses are separated by an intra-deposition cycle purge which lasts 4 seconds. Subsequent deposition cycles are separated by an inter-deposition cycle purge which lasts 1.5 seconds. A total of 60 deposition cycles are carried out to yield a TiAlC layer having a thickness of 14.3 nm. This process is carried out at a pressure of 3 Torr and a substrate temperature of 400° C. in a reaction chamber comprising a showerhead injector which is maintained at a temperature of 110° C. The aluminum precursor and the transition metal precursor are provided to the reaction chamber from an aluminum precursor source and a transition metal precursor source, respectively. The aluminum precursor source is maintained at a temperature of 50° C. The transition metal precursor source is maintained at room temperature. The layer is deposited on a thermal oxide layer grown on a monocrystalline silicon p-wafer in order to provide an insulating substrate that facilitates sheet resistance measurements. This yields a 14.3 nm thick TiAlC layer having a sheet resistance of 647 Ohm/square, with a non-uniformity (2 sigma) of only 0.9%. X-ray photoelectron spectroscopy (XPS) measurements indicated an elemental composition of 11.2 atomic percent aluminum, 34.5 atomic percent carbon, 14.6 atomic percent oxygen, and 36.4 atomic percent titanium. The oxygen concentration measured during XPS measurements is presumably not present in the as-deposited film, but is probably formed under influence of atmospheric air while the samples in question were transported from the deposition tool to the x-ray photoelectron spectrometer for characterization.

Figure 8:
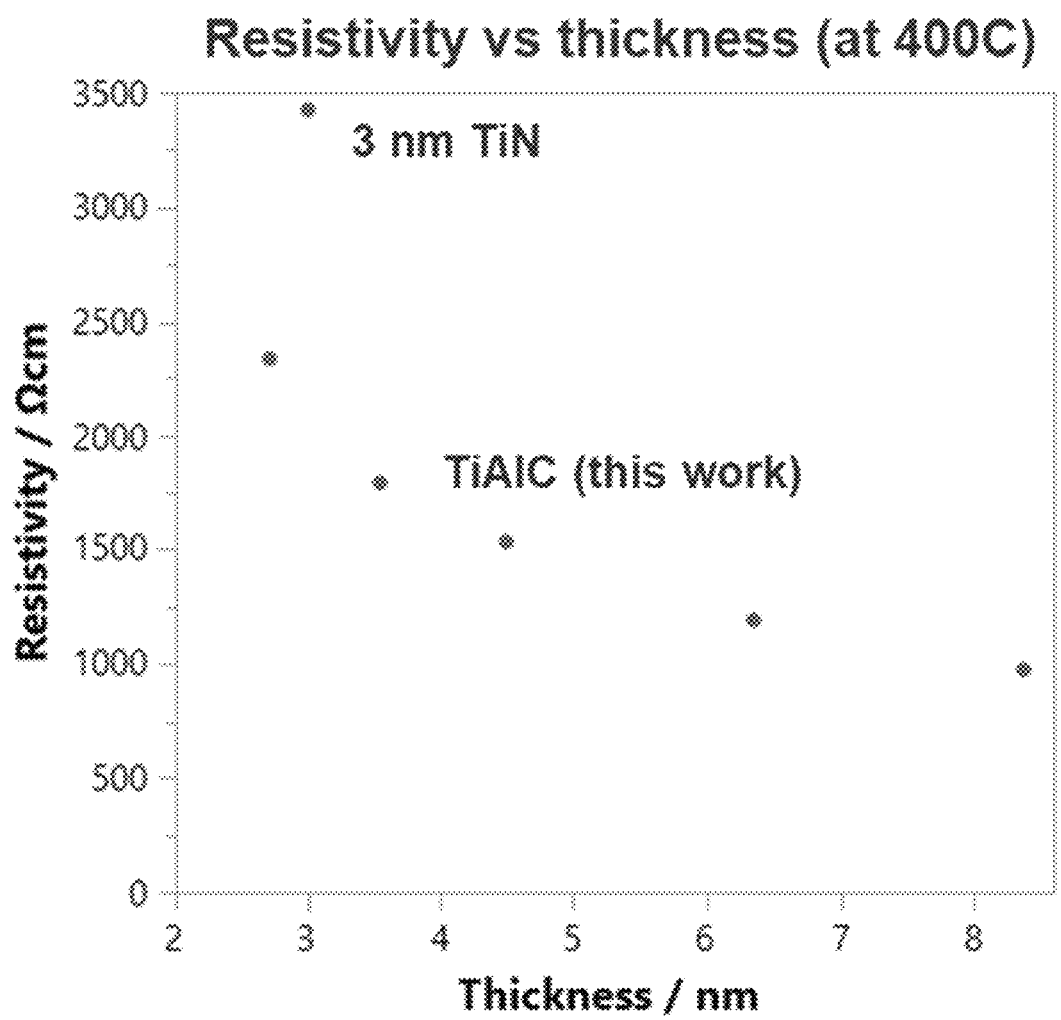
FIG. 8 shows experimental characteristics of an exemplary layer that is deposited according to an embodiment of a method as described herein.

As shown in FIG. 8, resistance of layers deposited by the present exemplary embodiment of a method as described herein favorably compare to a titanium nitride reference layer having a similar thickness. In particular, a 3 nm thick layer deposited by means of a method as described herein has a resistivity of around 2000 Ohm·cm compared to 3500 Ohm·cm for a titanium nitride layer having the same thickness.

A layer deposited according to the present exemplary embodiment was incorporated into a contact of a metal-oxide-semiconductor capacitor to measure its work function. The contact comprised the following material stack: TiN liner (~1.5 nm)/TiAlC layer deposited by means of a method as described herein/TiN cap. When the TiN cap was deposited on the TiAlC layer deposited by means of a method according to the present exemplary embodiment without intervening air break, an effective work function of 4.34 eV was obtained for a TiAlC layer having a thickness of 2 nm. When the TiN cap was deposited on the TiAlC layer after an intervening air break, i.e. after the TiAlC layer was exposed to atmospheric air, an effective work function of 4.42 eV was obtained for a TiAlC layer having a thickness of 2 nm. Thus, the effective work function of an electrode comprising a layer deposited according to an embodiment of the present disclosure can be tuned by exposing that layer to an oxygen containing gas, e.g. atmospheric air. Other suitable oxygen-containing gasses include water, ozone, oxygen, hydrogen peroxide, and the like.

In a specific embodiment of a method according to FIG. 1, a method as described herein may comprise transporting the substrate to different positions in a reaction chamber. In other words, the pulses and purges may be performed spatially instead of temporally. For example, the aluminum precursor pulse may comprise positioning the substrate in an aluminum precursor exposure chamber, and the transition metal precursor pulse may comprise positioning the substrate in a transition metal precursor exposure chamber. The purges may, in some embodiments, be suitably carried out by transporting the substrate through a purge gas curtain, i.e. through a region of a reaction chamber in which a purge gas is provided.

Figure 2:
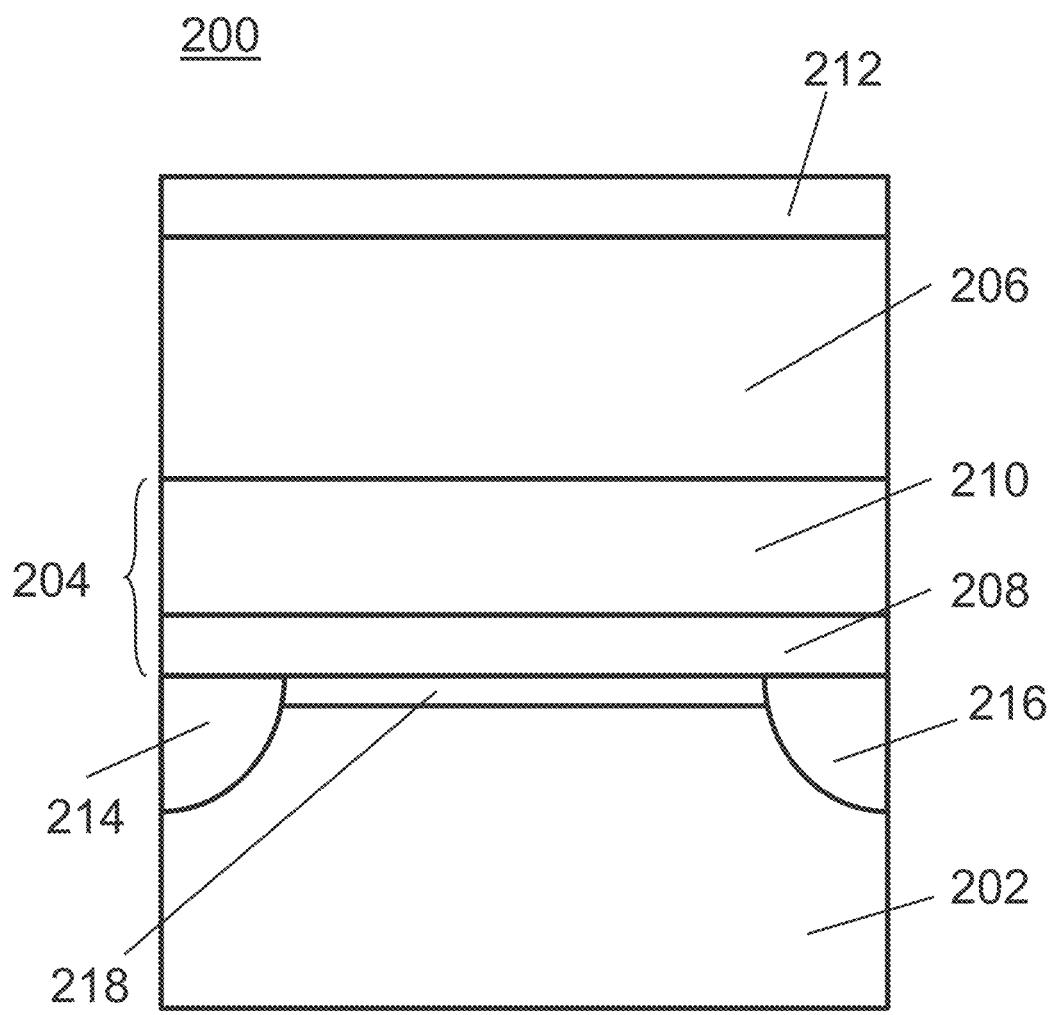
FIG. 2 illustrates an exemplary structure (200) in accordance with examples of the disclosure.

FIG. 2 illustrates an exemplary structure (200) in accordance with examples of the disclosure. The device or structure (200) includes a substrate (202), a dielectric or insulating material (204), and a layer (206) that is deposited according to a method as described herein. In the illustrated example, the structure (200) also includes an additional conducting layer (212).

In the illustrated example, the substrate (202) includes a source region (214), a drain region (216), and a channel region (218). Although illustrated as a horizontal structure, structures and devices in accordance with examples of the disclosure can include vertical and/or three-dimensional structures and devices, such as FinFET devices, and gate-all-around MOSFETs.

Figure 3:
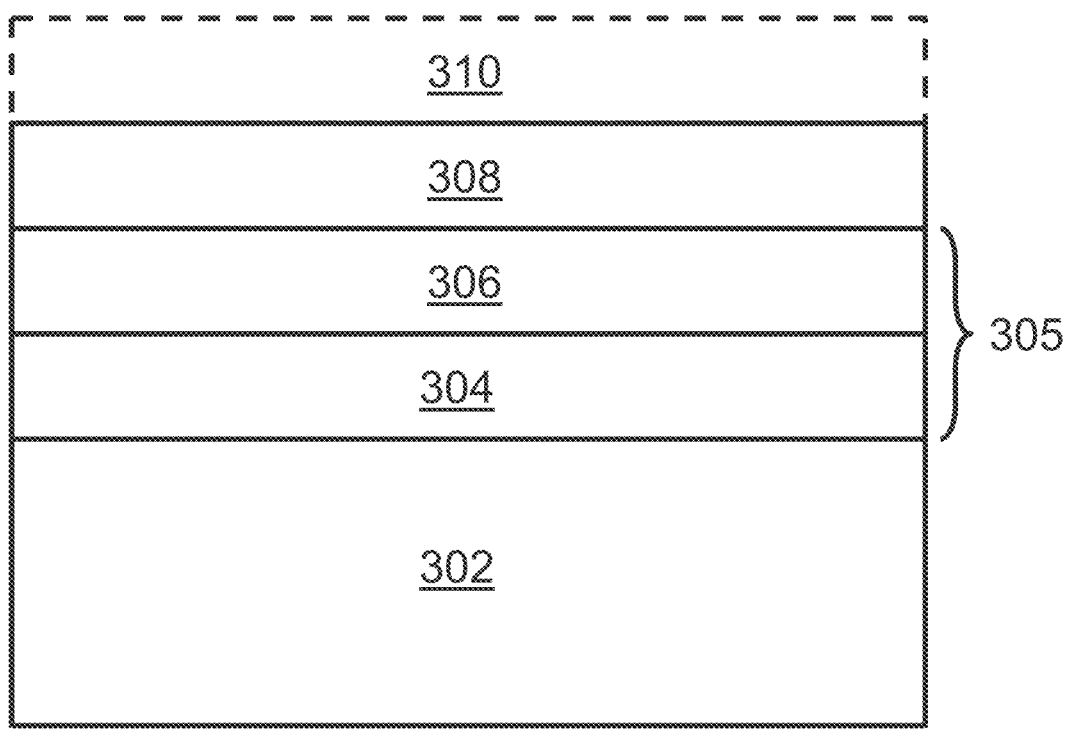
FIG. 3 illustrates a structure/a portion of a device (300) in accordance with additional examples of the disclosure.

FIG. 3 illustrates a structure/a portion of a device (300) in accordance with additional examples of the disclosure. The device or structure (300) includes a substrate (302), a dielectric or insulating material (305), and a layer (308) which is formed according to a method as described herein. In the illustrated example, the structure (300) also includes an additional conducting layer (310).

The substrate (302) can be or include any of the substrate materials described herein.

The dielectric or insulating material (305) can include one or more dielectric or insulating material layers. By way of example, the dielectric or insulating material (305) can include an interface layer (304) and a high-k material (306) deposited overlying interface layer (304). In some cases, the interface layer (304) may not exist or may not exist to an appreciable extent. The interface layer (304) can include an oxide, such as a silicon oxide, which can be formed on a surface of the substrate (302) using, for example, a chemical oxidation process or an oxide deposition process. The high-k material (306) can be or can include, for example, a metallic oxide having a dielectric constant greater than about 7. In some embodiments, the high-k material has a dielectric constant higher than the dielectric constant of silicon oxide. Exemplary high-k materials include one or more of hafnium oxide ($HfO_2$), tantalum oxide ($Ta_2O_5$), vanadium oxide ($VO_2$), zirconium oxide ($ZrO_2$), niobium oxide ($Nb_2O_5$), titanium oxide ($TiO_2$), aluminum oxide ($Al_2O_3$), lanthanum oxide ($La_2O_3$), mixtures thereof, and laminates thereof. Other exemplary high-k materials include silicates such as hafnium silicate ($HfSiO_x$), lanthanum silicate ($LaSiO_x$), titanium silicate ($TiSiO_x$), and thulium silicate ($TmSiO_x$), amongst others.

When the layer (308) is formed using a method as described herein, a concentration of its constituents can vary from a bottom of the layer (308) to a top of the layer 308 by, for example, controlling an amount of precursor and/or reactant and/or respective pulse times during one or more deposition cycles. In some cases, the layer (308) deposited according to a method as described herein can have a stoichiometric composition. A work function and other properties of this layer (308) can be altered by altering its composition.

The layer (308) deposited according to a method as described herein can include impurities, such as halides, hydrogen, and the like. In some embodiments, the impurity content may be less than one atomic percent, less than 0.2 atomic percent, or less than 0.1 atomic percent, or less than 0.05 atomic percent, alone or combined.

A thickness of the layer (308) deposited by means of a method as described herein can vary according to application. By way of example, this layer (308) has a thickness that can be less than 5 nm or about 0.2 nm to about 5 nm, or about 0.3 nm to about 3 nm, or about 0.3 nm to about 1 nm. When used, e.g., for controlling the threshold voltage in pMOS-FETS, the layer (308) deposited by means of a method as described herein may be relatively thin, which may be desirable for many applications, including work function and/or threshold voltage adjustment layers. Exemplary thicknesses are from 0.1 to 5.0 nm, 0.2 to 4.0 nm, 0.3 to 3.0 nm, 0.4 to 2.0 nm, 0.5 to 1.5 nm, 0.7 nm to 1.3 nm, or 0.9 nm to 1.1 nm. In some embodiments, the layer (308) may have a thickness of less than 0.1 nm. It shall be understood that such layers are not necessarily continuous, and may even consist of a plurality of isolated clusters of atoms and/or a plurality of isolated atoms.

Additionally or alternatively, the layer (308) deposited by means of a method as described herein can form a continuous film at a thickness of less than <5 nm, <4 nm, <3 nm, <2 nm, <1.5 nm, <1.2 nm, <1.0 nm, or <0.9 nm. The layer (308) deposited by means of a method as described herein can be relatively smooth, with relatively low grain boundary formation. In some cases, the layer (308) deposited according to a method as described herein may be amorphous, or may comprise amorphous regions. Additionally or alternatively, this layer (308) may comprise relatively low columnar crystal structures (as compared to TiN). RMS roughness of an exemplary layer (308) containing a metal nitride can be <1.0 nm, <0.7 nm, <0.5 nm, <0.4 nm, <0.35 nm, or <0.3 nm, at a thickness of less than 10 nm.

A work function of a layer (308) deposited according to a method as described herein can be >4.0 eV, >4.1 eV, >4.2 eV, >4.3 eV, >4.4 eV, >4.5 eV, >4.6 eV, >4.7 eV, >4.8 eV, >4.9 eV, >4.95 eV, or >5.0 eV. Alternatively, a work function of a layer (308) deposited according to a method as described herein can be <4.0 eV, <4.1 eV, <4.2 eV, <4.3 eV, <4.4 eV, <4.5 eV, <4.6 eV, <4.7 eV, <4.8 eV, <4.9 eV, <4.95 eV, or <5.0 eV. A work function value of a gate contact can be shifted by about 30 meV to about 400 meV, or about 30 meV to about 200 meV, or about 50 meV to about 100 meV using a layer deposited by means of a method as described herein, compared to a gate contact not comprising such a layer (308).

The additional conducting layer (312) can include, for example, metal, such as a refractory metal and/or a transition metal or the like.

Figure 4:
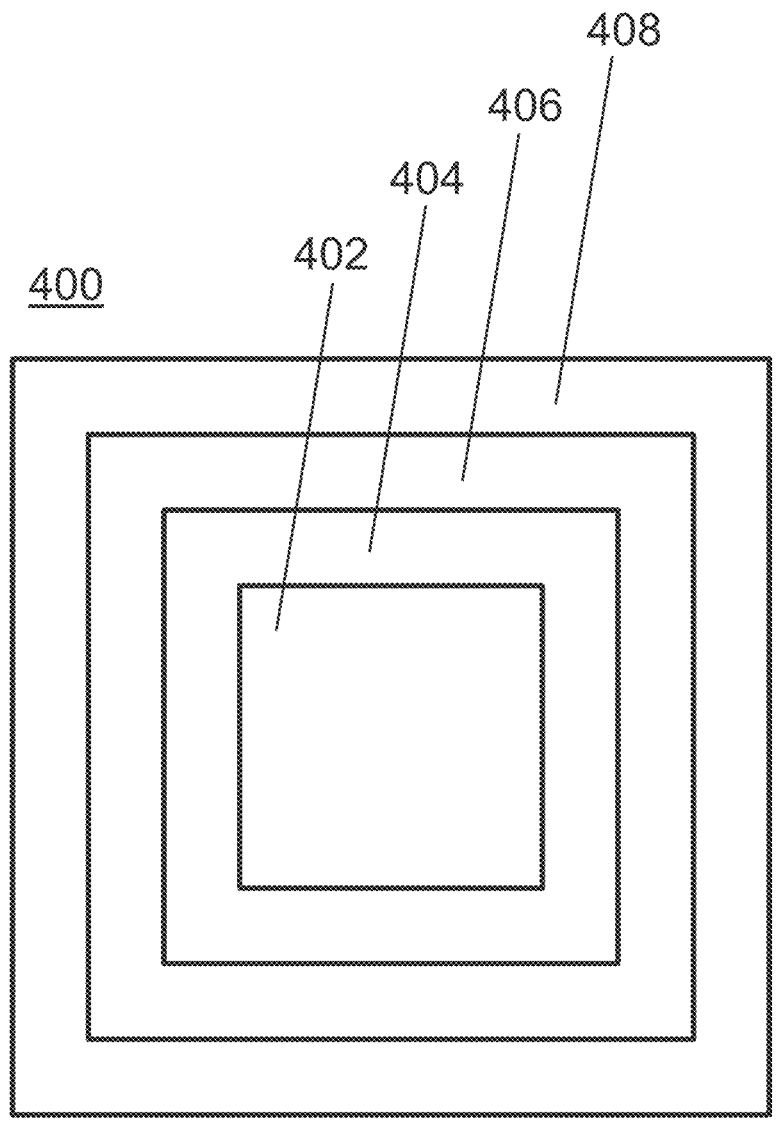
FIG. 4 illustrates another structure (400) in accordance with examples of the disclosure.

FIG. 4 illustrates another structure (400) in accordance with examples of the disclosure. This structure (400) is suitable for gate all around field effect transistors (GAA FET) (also referred to as lateral nanowire FET) devices and the like.

In the illustrated example, the structure (400) includes semiconductor material (402), dielectric material (404), a layer (406) containing a transition metal, aluminum, and carbon, and a conducting layer (408). The structure (400) can be formed overlying a substrate, including any substrate materials described herein. The layer (406) containing, a transition metal, aluminum, and carbon can be positioned between the conducting layer (408) and the dielectric material (406), as shown. Alternatively, the layer (406) containing a transition metal, aluminum, and carbon can be positioned inside the conducting layer (408) (embodiment not shown).

The semiconductor material (402) can include any suitable semiconducting material. For example, the semiconductor material (402) can include Group IV, Group III-V, or Group II-VI semiconductor material. By way of example, the semiconductor material (402) can include silicon.

The dielectric material (404) can be the same, or similar, to a dielectric, or insulating described elsewhere herein.

Figure 5:
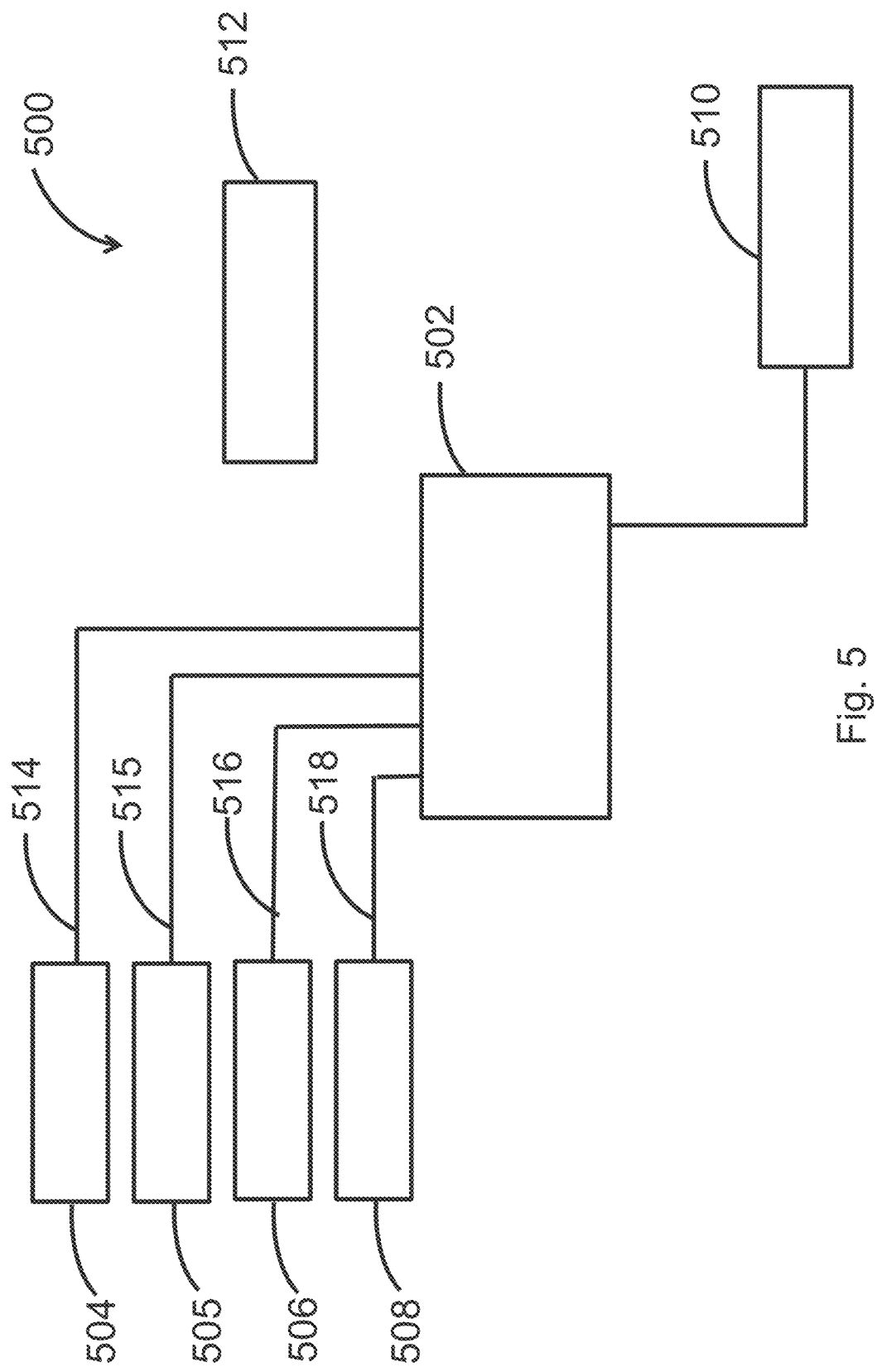
FIG. 5 illustrates a system (500) in accordance with yet additional exemplary embodiments of the disclosure.

FIG. 5 illustrates a system (500) in accordance with yet additional exemplary embodiments of the disclosure. The system (500) can be used to perform a method as described herein and/or form a structure or device portion as described herein.

In the illustrated example, the system (500) includes one or more reaction chambers (502), an aluminum precursor gas source (504), a transition metal precursor gas source (506), a purge gas source (508), an exhaust (510), and a controller (512).

The reaction chamber (502) can include any suitable reaction chamber, such as an ALD or CVD reaction chamber.

The aluminum precursor gas source (504) can include a vessel and one or more precursors as described herein—alone or mixed with one or more carrier (e.g., noble) gases. The transition metal precursor gas source (506) can include a vessel and one or more reactants as described herein—alone or mixed with one or more carrier gases. The purge gas source (508) can include one or more noble gases as described herein. Although illustrated with four gas sources (504)-(508), the system (500) can include any suitable number of gas sources. The gas sources (504)-(508) can be coupled to reaction chamber (502) via lines (514)-(518), which can each include flow controllers, valves, heaters, and the like.

The exhaust (510) can include one or more vacuum pumps.

The controller (512) includes electronic circuitry and software to selectively operate valves, manifolds, heaters, pumps and other components included in the system (500). Such circuitry and components operate to introduce precursors and purge gases from the respective sources (504)-(508). The controller (512) can control timing of gas pulse sequences, temperature of the substrate and/or reaction chamber, pressure within the reaction chamber, and various other operations to provide proper operation of the system (500). The controller (512) can include control software to electrically or pneumatically control valves to control flow of precursors, reactants and purge gases into and out of the reaction chamber (502). The controller (512) can include modules such as a software or hardware component, e.g., a FPGA or ASIC, which performs certain tasks. A module can advantageously be configured to reside on the addressable storage medium of the control system and be configured to execute one or more processes.

Other configurations of the system (500) are possible, including different numbers and kinds of precursor and reactant sources and purge gas sources. Further, it will be appreciated that there are many arrangements of valves, conduits, precursor sources, and purge gas sources that may be used to accomplish the goal of selectively feeding gases into the reaction chamber (502). Further, as a schematic representation of a system, many components have been omitted for simplicity of illustration, and such components may include, for example, various valves, manifolds, purifiers, heaters, containers, vents, and/or bypasses.

During operation of the reactor system (500), substrates, such as semiconductor wafers (not illustrated), are transferred from, e.g., a substrate handling system to the reaction chamber (502). Once substrate(s) are transferred to the reaction chamber (502), one or more gases from the gas sources (504)-(508), such as precursors, reactants, carrier gases, and/or purge gases, are introduced into the reaction chamber (502).

Figure 6:
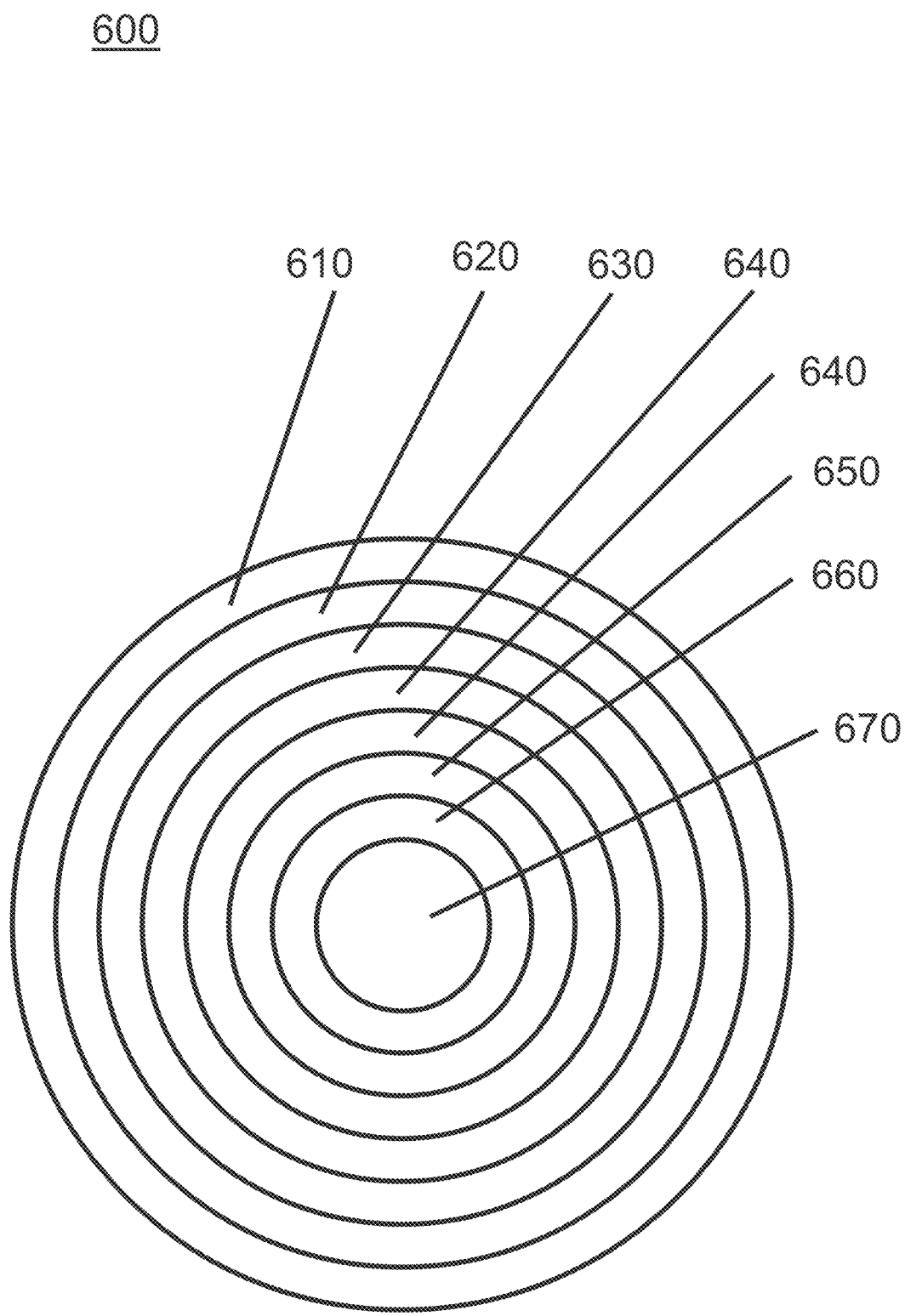
FIG. 6 illustrates an exemplary DRAM capacitor (600).

FIG. 6 illustrates an exemplary DRAM capacitor (600). It includes a top electrode (610,670) which comprises two parts, i.e. an inner shell and an outer shell, in the embodiment shown. This notwithstanding, the top electrode may comprise just one part, or may comprise more than two parts, e.g. three or more parts. It shall be understood that the two parts of the top electrode (610,670) in the embodiment of FIG. 6 are electrically connected to each other (connection not shown), i.e. it shall be understood that during normal operation, they are kept at the same, or approximately the same, electrical potential. The top electrode (610,670) comprises a layer that is deposited by means of a method as described herein. The top electrode (610,670) may, for example, have a thickness of at least 0.5 nm to 5.0 nm, or of at least 1.0 nm to at most 4.0 nm, or of at least 2.0 nm to at most 3.0 nm, or of at least 0.5 nm to at most 2.5 nm, or of at least 0.6 nm to at most 2.0 nm, or of at least 0.7 nm to at most 1.5 nm. The DRAM capacitor (600) further comprises a bottom electrode (640). The bottom electrode (640) comprises a layer deposited by means of a method as described herein. In some embodiments, the composition of the bottom electrode (640) equals the composition of the top electrode (610,670). Alternatively, the composition of the bottom electrode (640) may differ from the composition of the top electrode (610,670). The bottom electrode (640) may, for example, have a thickness of at least 1.0 nm to at most 10.0 nm or of at least 3.0 nm to at most 7.0 nm, or of at least 0.5 nm to 5.0 nm, or of at least 1.0 nm to at most 4.0 nm, or of at least 2.0 nm to at most 3.0 nm, or of at least 0.5 nm to at most 2.5 nm, or of at least 0.6 nm to at most 2.0 nm, or of at least 0.7 nm to at most 1.5 nm. The bottom electrode (640) is separated from an outer shell of the top electrode (610) by one or more dielectric layers (620,630). The embodiment shown features two dielectric layers (620,630). The one or more dielectric layers (620,630) may comprise a high-k dielectric. For example, the high-k dielectric may be selected from the list comprising hafnium oxide ($HfO_2$), tantalum oxide ($Ta_2O_5$), vanadium oxide ($VO_2$), niobium oxide ($Nb_2O_5$), zirconium oxide ($ZrO_2$), titanium oxide ($TiO_2$), aluminum oxide ($Al_2O_3$), lanthanum oxide ($La_2O_3$), mixtures thereof, and laminates thereof. Other exemplary high-k materials include silicates such as hafnium silicate (HfSiO$_x$), lanthanum silicate (LaSiO$_x$), titanium silicate (TiSiO$_x$), and thulium silicate (TmSiO$_x$), amongst others. In some embodiments, dielectric layer (620) has the same composition as dielectric layer (630). In some embodiments, dielectric layer (620) has a different composition than dielectric layer (630). The combined thickness of the two dielectric layers (620,630) may be, for example, from at least 0.5 nm to at most 10.0 nm or of at least 1.0 nm to at most 8.0 nm, or of at least 2.0 nm to at most 6.0 nm, or of at least 3.0 nm to at most 4.0 nm. An inner shell of the top electrode (670) is separated from the bottom electrode (640) by means of one or more dielectric layers (650,660). The embodiment shown features two such dielectric layers. The one or more dielectric layers (650,660) may comprise a high-k dielectric. For example, the high-k dielectric may be selected from the list comprising hafnium oxide (HfO$_2$), tantalum oxide (Ta$_2$O$_5$), vanadium oxide (VO$_2$), niobium oxide (Nb$_2$O$_5$), zirconium oxide (ZrO$_2$), titanium oxide (TiO$_2$), aluminum oxide (Al$_2$O$_3$) or lanthanum oxide (La$_2$O$_3$), and mixtures/laminates thereof. Other exemplary high-k materials include silicates such as hafnium silicate (HfSiO$_x$), lanthanum silicate (LaSiO$_x$), titanium silicate (TiSiO$_x$), and thulium silicate (TmSiO$_x$), amongst others. In some embodiments, dielectric layer (650) has the same composition as dielectric layer (660). In some embodiments, dielectric layer (650) has a different composition than dielectric layer (660). The combined thickness of the dielectric layers (650,660) may be, for example, from at least 0.5 nm to at most 10.0 nm or of at least 1.0 nm to at most 8.0 nm, or of at least 2.0 nm to at most 6.0 nm, or of at least 3.0 nm to at most 4.0 nm. In some embodiments, the thickness of the one or more dielectric layers (620,630) between the outer shell of the top electrode (610) and the bottom electrode (640) equals the thickness of the one or more dielectric layers (650,660) between the inner shell of the top electrode (670) and the bottom electrode (640), e.g. within a margin of error of less than 2.0 nm, or less than 1.5 nm, or less than 1.0 nm, or less than 0.5 nm, or less than 0.4 nm, or less than 0.3 nm, or less than 0.2 nm, or less than 0.1 nm. A gap filling dielectric (680) may be centrally disposed in the DRAM capacitor (680). Exemplary gap filling dielectrics include low-k dielectrics, e.g. SiOC, SiOCN, and the like.

Figure 7:
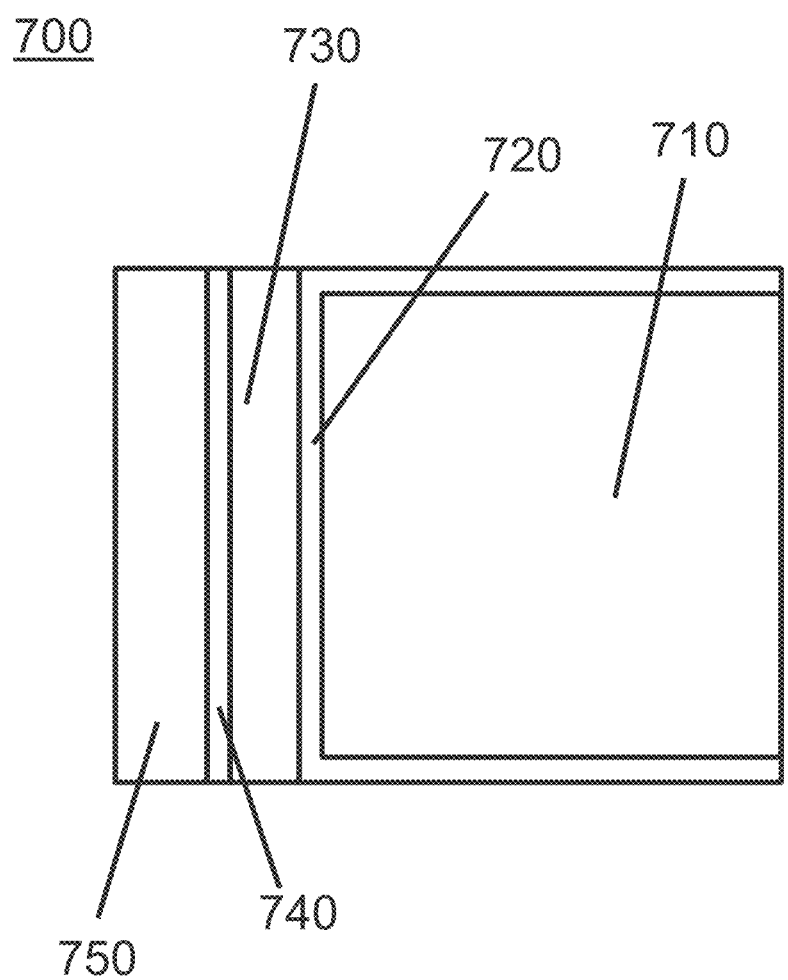
FIG. 7 illustrates a part of a VNAND cell, namely a contact and charge trapping assembly (700).

FIG. 7 illustrates a part of a VNAND cell, namely a contact and charge trapping assembly (700). The contact and charge trapping assembly (700) comprises a metal layer (710). The metal layer (710) may be made from a metal such as copper, tungsten, etc. Alternatively, the metal layer (710) may comprise a layer that is deposited according to a method as described herein. As illustrated in FIG. 7, the metal layer (710) may be lined with a liner (720). The liner may improve adhesion and/or may prevent or at least minimize out diffusion of metal, e.g. copper or tungsten, from the metal layer (710). Advantageously, the liner (720) comprises a layer that is deposited by means of a method as described herein. The contact and charge trapping assembly (700) comprises a charge trapping layer (740). The charge trapping layer (740) is positioned between two dielectric layers (730,750). The charge trapping layer may comprise a conductive layer such as, for example, silicon nitride. Additionally or alternatively, the charge trapping layer may comprise a layer that is deposited by means of a method as described herein. One of the dielectric layers (730) is adjacent to the liner (720). This dielectric layer (730) may, for example, comprise a high-k material. For example, the high-k dielectric may be selected from the list comprising hafnium oxide (HfO$_2$), tantalum oxide (Ta$_2$O$_5$), vanadium oxide (VO$_2$), niobium oxide (Nb$_2$O$_5$), zirconium oxide (ZrO$_2$), titanium oxide (TiO$_2$), aluminum oxide (Al$_2$O$_3$) or lanthanum oxide (La$_2$O$_3$), and mixtures/laminates thereof. Other exemplary high-k dielectrics include silicates such as hafnium silicate (HfSiO$_x$), lanthanum silicate (LaSiO$_x$), titanium silicate (TiSiO$_x$), and thulium silicate (TmSiO$_x$), amongst others. In a suitable configuration in a VNAND memory architecture, the other dielectric layer (750) may serve as a tunnel layer, and may be adjacent to a, e.g. doped polysilicon, channel layer (not shown).

Figure 9:
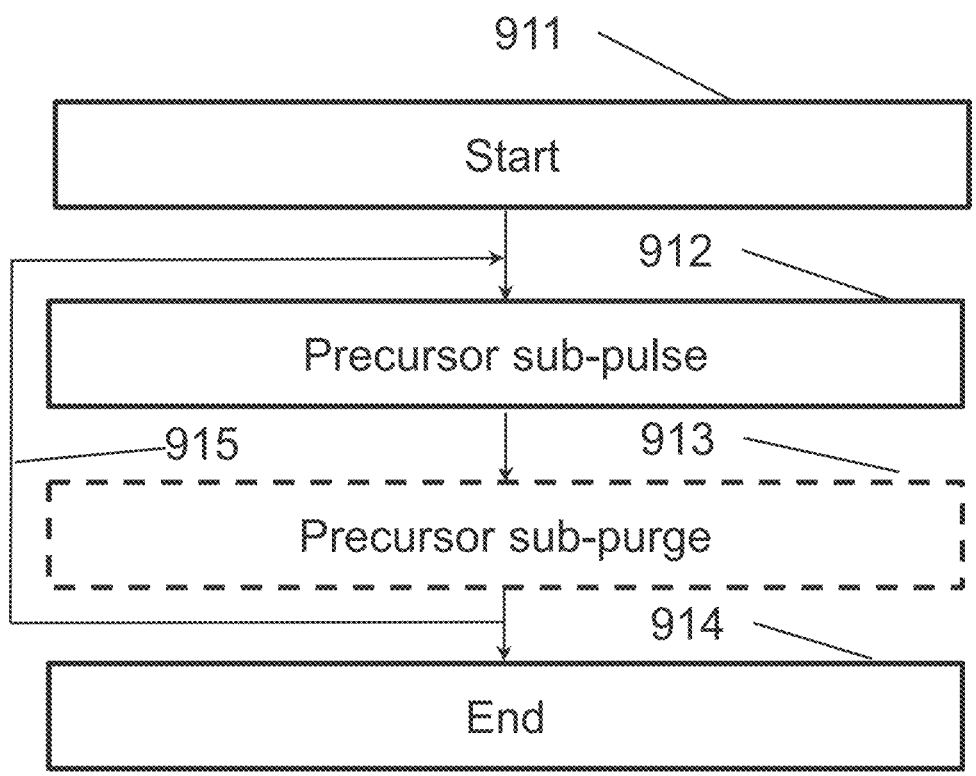
FIG. 9 shows an exemplary flow chart of an embodiment of a precursor pulse as described herein.

FIG. 9 shows an embodiment of a precursor pulse, e.g. an aluminum precursor pulse or a transition metal precursor pulse, according to an exemplary method as disclosed herein. The precursor pulse starts (911) and a precursor sub-pulse (912) is carried out. The precursor sub-pulse is then followed by a precursor sub-purge (913). The precursor sub-pulse (912) and the precursor sub-purge (913) are then repeated (915) for a pre-determined amount of times, e.g. from at least 1 to at most 10 times, until the precursor pulse ends (914).

Further, an embodiment of a method as disclosed herein is discussed in which a precursor pulse according to FIG. 9 is incorporated. This particular embodiment of a method as described herein can be carried out at any suitable temperature. The method is carried out at a pressure of 3 Torr and starts with a priming step in which a total of 10 priming pulses are performed. During the priming pulses, the substrate is exposed to TiCl$_4$. The priming pulses are separated by priming purges. The priming pulses last 2 seconds and the priming purges last 1.5 seconds. After the priming step, 30 deposition cycles are carried out. A deposition cycle comprises an aluminum precursor pulse and a transition metal precursor pulse. The aluminum precursor pulse comprises 2 to 7 aluminum precursor sub-pulses. Each aluminum precursor sub-pulse is followed by an aluminum precursor sub-purge. During the aluminum precursor sub-pulses, the substrate is exposed to bis(1,1-dimethylethyl)methylaluminum. During the purges, a purge gas is provided to the reaction chamber. The aluminum precursor sub-pulses last 3 seconds, and the aluminum precursor sub-purges last 6 seconds. During the transition metal precursor pulse, the substrate is continuously exposed to TiCl$_4$ for 3 seconds. The transition metal precursor pulse is followed by a transition metal precursor purge. The transition metal precursor purge lasts 1.5 seconds.

In an exemplary embodiment, a method as disclosed herein is employed for forming a layer comprising titanium (Ti), aluminum (Al), and carbon. Bis(tert-butyl)methylaluminum is used as an aluminum precursor and TiCl$_4$ is used as a titanium precursor. Advantageously, bis(tert-butyl)methylaluminum is stable for 8 weeks at 62° C., at which temperature its vapor pressure is 1 Torr, which is a suitable value for cyclical deposition processes such as atomic layer deposition (ALD) processes. During the method, the reaction chamber was maintained at a pressure of 3 Torr, and the susceptor was maintained at a temperature of 335° C.

First, a priming step was executed in which the substrate was exposed to ten discrete priming pulses. Each priming pulse comprised exposing the substrate to the titanium precursor for two seconds. The priming pulses were separated by priming purges during which the substrate was exposed to Ar. The priming purges lasted 1.5 seconds.

After the priming step, 30 deposition cycles were executed. A deposition cycle comprises an aluminum precursor pulse and a titanium precursor pulse. The aluminum precursor pulse and the titanium precursor pulse were separated by a purge that lasts 6 seconds.

The aluminum precursor was provided to the reaction chamber in aluminum precursor pulses that in turn comprised five discrete sub-pulses. During the sub-pulses, the substrate was exposed to the aluminum precursor. During the sub-purges, the substrate was exposed to Ar. The sub-pulses lasted 3 seconds, and the sub-purges lasted 6 seconds.

The titanium precursor was provided to the reaction chamber in titanium precursor pulses that lasted 3 seconds. The titanium precursor pulses were followed by titanium precursor purges that lasted 1.5 seconds. During a titanium precursor pulse, the substrate was continually exposed to the titanium precursor.

The resulting titanium aluminum carbide (TiAlC) films advantageously have a low resistivity of around 1500 µΩcm at thicknesses below 3 nm, and a work function of around 4.5 eV at a thickness of 2 nm. Meanwhile, the resistivity shows an outstanding stability over a wide range of thicknesses and deposition temperatures. The layers have high Al content (>11%) with good elemental composition uniformity across the film. The low resistivity and sheet resistance remains stable over 3 days, confirming that the deposited layer is stable.

Figure 10:
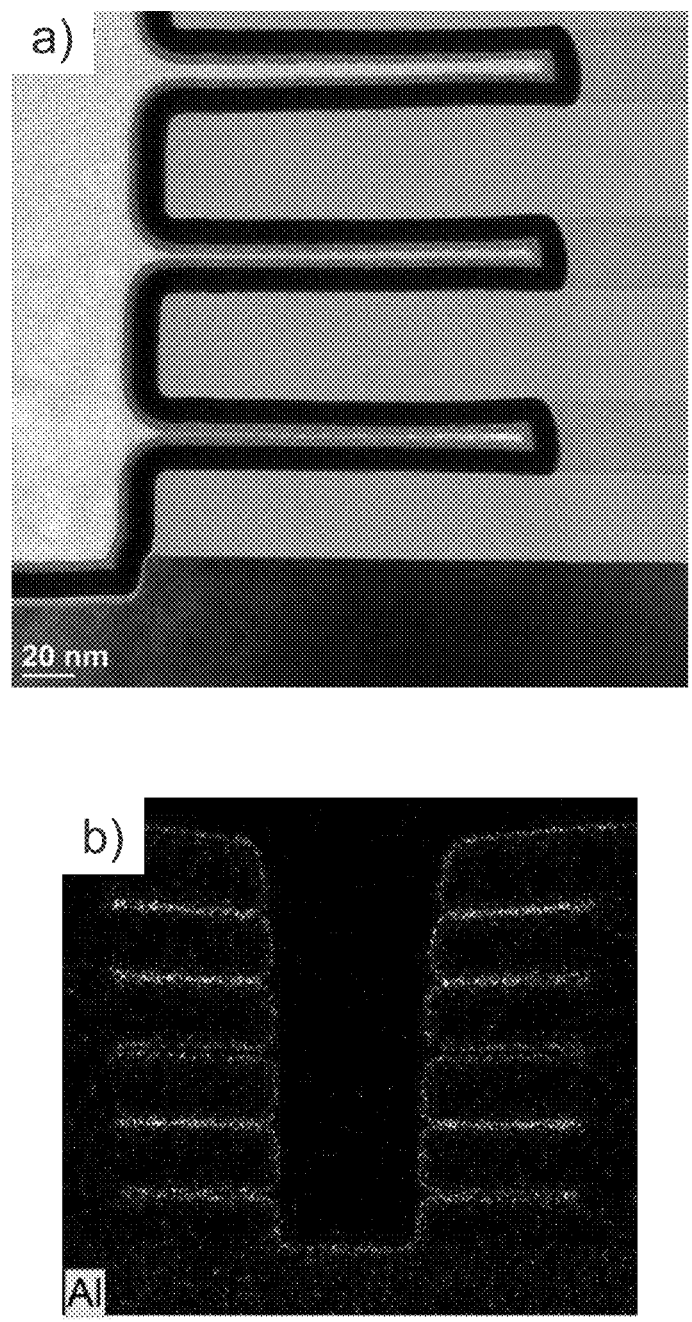
FIG. 10 shows a scanning electron microscopy micrograph and an energy dispersive x-ray spectroscopy map.

A layer formed according to this exemplary embodiment shows a good step coverage on a horizontal cavity structure, as shown in the transmission electron microscopy micrograph shown in FIG. 10, panel a). From the Energy Dispersive X-Ray Spectroscopy (EDS) profile shown in FIG. 10, panel b), an outstanding Al distribution on horizontal cavity structure with both top and bottom sides can be seen.

The effective work function (eWF) of the resulting TiAlC layers provides ~4.5 eV at 2 nm thickness, which lies in the sweetspot of the silicon mid-gap. It shall be understood that the TiAlC can, for example, be formed directly on a high-k dielectric such as a $HfO_2$. Alternatively, a layer formed according to this exemplary embodiment can be formed overlying a liner, such as a TiN liner. The liner can, for example, have a thickness of around 0.5 nm. Note that a TiN liner is not necessarily closed at a thickness of 0.5 nm, i.e. the liner can contain one or more of pin-holes, isolated islands, and holes.

The example embodiments of the disclosure described above do not limit the scope of the invention, since these embodiments are merely examples of the embodiments of the invention, which is defined by the appended claims and their legal equivalents. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

The invention claimed is:

1. A method for forming a layer on a substrate, the method comprising:
    providing the substrate in a reaction chamber;
    executing a plurality of deposition cycles;
    wherein a deposition cycle comprises
        an aluminum precursor pulse, the aluminum precursor pulse comprising exposing the substrate to an aluminum precursor, the aluminum precursor comprising aluminum, a first alkyl ligand, and a second alkyl ligand, the first alkyl ligand and the second alkyl ligand being different; and,
        a transition metal precursor pulse, the transition metal precursor pulse comprising exposing the substrate to a transition metal precursor, the transition metal precursor comprising a transition metal;
    thus forming the layer on the substrate, the layer comprising the transition metal, the aluminum, and carbon.

2. The method according to claim 1 wherein executing a plurality of deposition cycles is preceded by executing one or more priming steps, a priming step comprising exposing the substrate to the transition metal precursor.

3. The method according to claim 1 wherein the aluminum precursor comprises a chemical compound represented by the formula $(L_1)_n(L_2)_{n-1}Al$, wherein $L_1$ is the first alkyl ligand, $L_2$ is the second alkyl ligand, and n is an integer that equals 1 or 2.

4. The method according to claim 3 wherein $L_1$ is 1,1-dimethylethyl.

5. The method according to claim 3 wherein $L_2$ is methyl.

6. The method according to claim 1 wherein the first alkyl ligand is a C1 to C5 alkyl.

7. The method according to claim 1 wherein the second alkyl ligand is a C1 to C5 alkyl.

8. The method according to claim 1 wherein the aluminum precursor comprises bis(1,1-dimethylethyl)methylaluminum.

9. The method according to claim 1 wherein the transition metal precursor comprises a halogen.

10. The method according to claim 9 wherein the halogen comprises chlorine.

11. The method according to claim 1 wherein the transition metal is selected from tantalum, hafnium, vanadium, zirconium, niobium, molybdenum, tungsten, and titanium.

12. The method according to claim 1 wherein subsequent deposition cycles are separated by an inter deposition cycle purge.

13. The method according to claim 2 wherein the aluminum precursor pulse and the transition metal precursor pulse are separated by an intra deposition cycle purge.

14. The method according to claim 1 wherein the deposition cycles are executed in absence of a plasma.

15. The method according to claim 1 wherein the method is carried out until a layer having a thickness of least 0.2 nm to at most 5 nm is formed on the substrate.

16. The method according to claim 1 wherein the substrate comprises a monocrystalline silicon wafer.

17. The method according to claim 1 further comprising a step of exposing the substrate to an oxygen containing gas, thereby at least partially oxidizing the layer comprising the transition metal, the aluminum, and carbon.

* * * * *